United States Patent
Kikuma et al.

(10) Patent No.: US 6,621,169 B2
(45) Date of Patent: Sep. 16, 2003

(54) STACKED SEMICONDUCTOR DEVICE AND METHOD OF PRODUCING THE SAME

(75) Inventors: Katsuhito Kikuma, Kawasaki (JP); Mitsutaka Ikeda, Kawasaki (JP); Yoshihiro Tsukidate, Kawasaki (JP); Yuji Akashi, Kasugai (JP); Kaname Ozawa, Kawasaki (JP); Akira Takashima, Kawasaki (JP); Tadashi Uno, Kawasaki (JP); Takao Nishimura, Kawasaki (JP); Fumihiko Ando, Kawasaki (JP); Hiroshi Onodera, Shibata (JP); Hayato Okuda, Shibata (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/940,625

(22) Filed: Aug. 29, 2001

(65) Prior Publication Data

US 2002/0027295 A1 Mar. 7, 2002

(30) Foreign Application Priority Data

Sep. 4, 2000 (JP) .......................... 2000-267621
Apr. 19, 2001 (JP) .......................... 2001-121539

(51) Int. Cl.⁷ .......................... H01L 23/58; H01L 23/48; H01L 23/29
(52) U.S. Cl. .......................... 257/780; 257/777; 257/48; 257/798; 257/697; 257/738
(58) Field of Search .......................... 257/777, 780, 257/48, 798, 697, 738

(56) References Cited

U.S. PATENT DOCUMENTS

| | | | | |
|---|---|---|---|---|
| 5,422,435 A | * | 6/1995 | Takiar et al. | 174/52.4 |
| 5,990,545 A | * | 11/1999 | Schueller et al. | 257/697 |
| 5,994,166 A | * | 11/1999 | Akram et al. | 438/108 |
| 6,265,763 B1 | * | 7/2001 | Jao et al. | 257/676 |

FOREIGN PATENT DOCUMENTS

JP 2000-68443 3/2000

* cited by examiner

Primary Examiner—Eddie Lee
Assistant Examiner—Joseph Nguyen
(74) Attorney, Agent, or Firm—Armstrong, Westerman & Hattori, LLP

(57) ABSTRACT

In a stacked semiconductor device which has a plurality of semiconductor chips of desired sizes stacked as one package, a first semiconductor chip is mounted on a flexible printed wiring board provided with external connecting terminals. A printed circuit board is placed and mounted on the first semiconductor chip by flip-chip bonding. A second semiconductor chip is secured onto the printed circuit board. The second semiconductor chip is connected to the flexible printed wiring board by wire bonding. The first semiconductor chip is connected to the flexible printed wiring board by wire bonding via the printed circuit board.

4 Claims, 26 Drawing Sheets

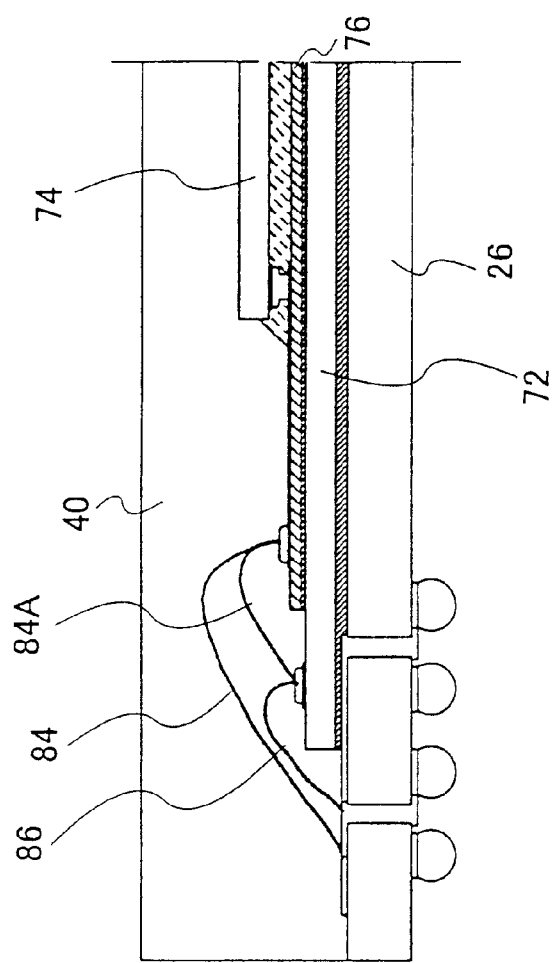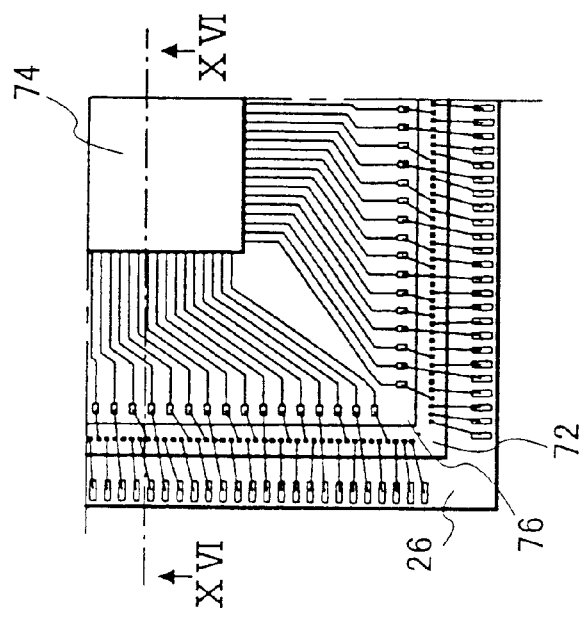

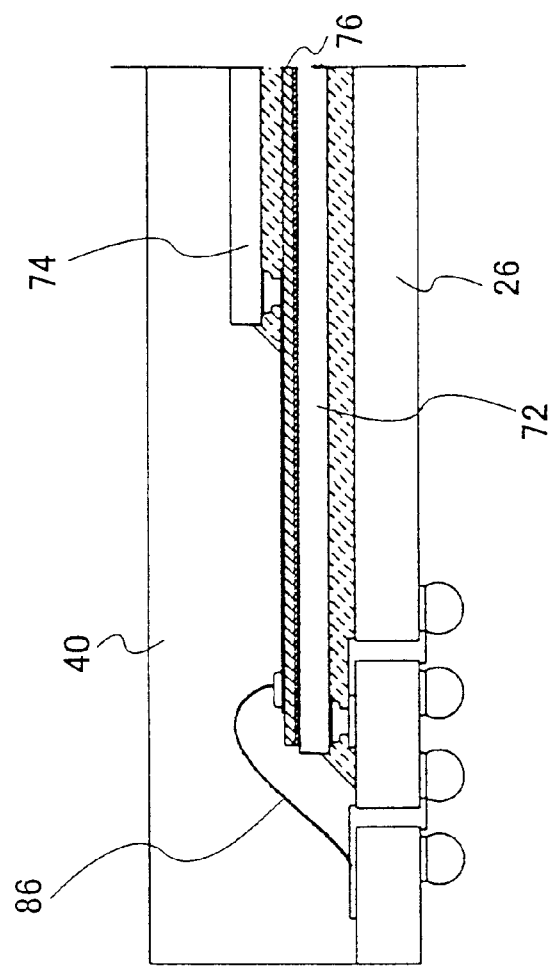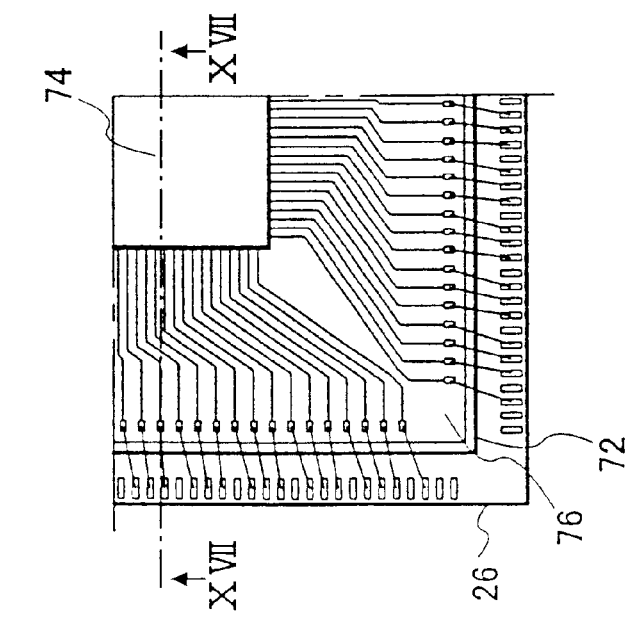

STACKED SEMICONDUCTOR DEVICE AND METHOD OF PRODUCING THE SAME

BACKGROUND OF THE INVENTION

1. Field of the Invention

The present invention generally relates to semiconductor devices and methods of producing the semiconductor devices, and, more particularly, to a stacked semiconductor device having a plurality of semiconductor chips stacked as one package and a method of producing such a stacked semiconductor device.

2. Description of the Related Art

In recent years, portable electronic devices such as mobile telephones and non-volatile memory media such as IC memory cards have been becoming smaller and smaller. Along with this trend, there have been demands for devices and memory media having a smaller number of components and a smaller size. Accordingly, it is desired to develop a technique of effectively packaging semiconductor chips that are main components constituting those electronic devices and memory media. Examples of such packages that satisfy the above demands include a chip scale package (CSP) that is almost as small as a semiconductor chip and a multi-chip package (MCP) that accommodates a plurality of semiconductor chips in one package.

The CSP or MCP is realized by stacking and turning a plurality of semiconductor chips into one package. This technique is represented by a stacked multi-chip package (S-MCP).

FIG. 1 shows the structure of a conventional S-MCP in which two semiconductor chips are stacked. As shown in FIG. 1, a semiconductor chip 2 is mounted on a substrate 4, and another semiconductor chip 6 that is smaller than the semiconductor chip 2 is stacked on the semiconductor chip 2. Electrodes of the semiconductor chips 2 and 6 are connected to the pads of a substrate 4 by bonding wires 8, and the pads of the substrate 4 are electrically connected to external connecting terminals 10. The semiconductor chips 2 and 6, and the bonding wires 8 are encapsulated by an encapsulation resin 12.

A stacked CSP has a stacked structure to that of the S-MCP shown in FIG. 1.

In the above conventional S-MCP, however, the upper semiconductor chip 6 must be smaller than the lower semiconductor chip 2. The upper semiconductor chip 6 needs to be small enough not to cover the electrodes of the lower semiconductor chip 2. On the other hand, if the upper semiconductor chip 6 is much too smaller than the lower semiconductor chip 2, the distance between the electrodes of the upper semiconductor chip 6 and the pads of the substrate 4 becomes too long to perform a proper wire bonding operation.

FIGS. 2A to 2D show the positional relationship between the upper semiconductor chip and the lower semiconductor chip.

FIG. 2A shows the positional relationship between two properly stacked semiconductor chips. More specifically, the upper semiconductor chip 6 is small enough not to cover the electrodes of the lower semiconductor chip 2, and the electrodes of the upper semiconductor chip 6 and the electrodes of the lower semiconductor chip 2 can be connected to the pads of the substrate 4 by bonding wires.

FIG. 2B shows semiconductor chips that cannot be stacked. More specifically, the upper semiconductor chip 6 is almost as large as the lower semiconductor chip 2 in FIG. 2B. If the upper semiconductor chip 6 is stacked on the lower semiconductor chip 2, the upper semiconductor chip 6 will cover the electrodes of the lower semiconductor chip 2, resulting in a failure in the wire bonding of the electrodes of the lower semiconductor chip 2.

FIG. 2C shows an example in which the two semiconductor chips can be stacked, but there is a problem with the wire bonding. More specifically, since the upper semiconductor chip 6 is much smaller than the lower semiconductor chip 2 in FIG. 2C, the distance between the electrodes of the upper semiconductor chip 6 and the pads of the substrate 4 becomes too long to perform a proper wire bonding process. Even if the wire bonding is successful, the bonding wires 8 are so long that it needs to be bent. In such a case, the bent portion might touch other components in the surrounding area, resulting in other problems.

FIG. 2D shows an example in which the two semiconductor chips can be stacked, but the package size becomes too large. More specifically, in FIG. 2D, the upper semiconductor chip 6 can be stacked on the lower semiconductor chip 2, without covering the electrodes of lower semiconductor chip 2. However, the upper semiconductor chip 6 is too large in width, resulting in sticking out from the lower semiconductor chip 2 to a great extent. In this structure, the package cannot be made smaller in size. Also, since the sticking out portions of the upper semiconductor chip are not supported from below, the upper semiconductor chip 6 might be damaged by a pressing force caused by the capillary of a wire bonder pressed against the electrodes of the upper semiconductor chip 6.

As described above, in the conventional S-MCP, semiconductor chips of the same size (i.e., of the same type) cannot be stacked. As the sizes of the semiconductor chips that can be stacked are limited, the types of the semiconductor chips that can be employed in the S-MCP are also limited.

Examples of the method of stacking semiconductor chips of the same type include a method of bonding two reverse semiconductor chips. In this method, the reverse sides of both reverse semiconductor chips are bonded to each other, so that the electrodes are symmetrically arranged. However, two different types of masks are required in the production process of such reverse semiconductor chips, resulting in high production costs.

In a case of rectangular semiconductor chips, the semiconductor chips of the same type can be rotated by 90 degrees with each other and arranged in a cross-like form. However, there still is the same problem as described above with reference to FIG. 2D.

SUMMARY OF THE INVENTION

A general object of the present invention is to provide stacked semiconductor devices and methods of producing the semiconductor devices in which the above disadvantages are eliminated.

A more specific object of the present invention is to provide a stacked semiconductor device in which a plurality of semiconductor chips of desired sizes are stacked as one package.

Another specific object of the present invention is to provide a method of producing such a semiconductor device.

The above objects of the present invention are achieved by a stacked semiconductor device which comprises:

a first substrate that has external connecting terminals;

first terminals that are placed on a surface of the first substrate opposite to a surface of the first substrate on which the external connecting terminals of the first substrate are formed;

at least one first semiconductor chip that is mounted on the first substrate;

a second substrate that is placed on the first semiconductor chip;

at least one second semiconductor chip that is mounted on the second substrate; and second terminals that are formed on the second substrate and electrically connected to at least one of the first semiconductor chip and the second semiconductor chip, the second terminals being connected to the first terminals by wire bonding.

According to the above-mentioned invention, one of the first and second semiconductor chips is electrically connected directly to the first substrate provided with the external connecting electrodes, and the other one is electrically connected to the first substrate via the second substrate. Accordingly, even if the first and second semiconductor chips are of the same size, one of the semiconductor chips can be connected directly to first terminals of the first substrate, while the other can be electrically connected to the first substrate via second terminals of the second substrate by wire bonding. Also, if the second semiconductor chip is much smaller than the first semiconductor chip, the first semiconductor chip can be connected directly to the first terminals of the first substrate by wire bonding, and the second semiconductor chip can be electrically connected to the first terminals of the first substrate via the second terminals of the second substrate by wire bonding. Accordingly, by simply employing the second substrate between the first and second semiconductor chips, a plurality of semiconductor chips of desired sizes can be stacked as one package.

The above objects of the present invention are also achieved by a stacked semiconductor device which comprises:

a first substrate that has external connecting terminals;

a plurality of semiconductor chips that are stacked on one another and mounted on the first substrate; and second substrates that are interposed between the plurality of semiconductor chips, wherein:

the plurality of semiconductor chips and the second substrates are placed on the first substrate;

each of the second substrates has an extending portion that extends beyond an outer periphery of the semiconductor chip located immediately above the second substrate;

the extending portion is provided with bonding pads that are electrically connected to at least one of the semiconductor chip located immediately above each second substrate and the semiconductor chip located immediately below the second substrate; and the bonding pads are electrically connected to the first substrate by wire bonding.

According to the above-mentioned invention, an arbitrary number of semiconductor chips can be arranged on the first substrate and packaged in a stacked state. For example, the semiconductor chips are of the same kind, and stacked in a direction perpendicular to the first substrate. Additionally, the length of the extending portions of the second substrates may be increased toward the first substrate, and each of the second substrate my be connected to another one of the second substrates located immediately below from the uppermost second substrate to the lowermost second substrate, and the lowermost second substrate may be connected to the first substrate by wire bonding. Alternatively, the extending portions of the second substrates may have the same length, and the each of the second substrates may be connected to the first substrate by wire bonding.

Additionally, the above objects of the present invention are also achieved by a stacked semiconductor device which comprises:

a first substrate that has external connecting terminals;

first terminals that are placed on a surface of the first substrate opposite to a surface of the first substrate on which the external connecting terminals of the first substrate are formed;

at least one first semiconductor chip that is mounted on the first substrate;

a redistribution layer provided on the first semiconductor chip;

at least one second semiconductor chip that is mounted on the redistribution layer; and a third semiconductor chip that is used for testing at least one of the first and second semiconductor chips, the third semiconductor chip being mounted on the redistribution layer, wherein at least one of the first and second semiconductor chip is electrically connected to the first substrate via the redistribution layer, and the third semiconductor chip is electrically connected to the redistribution layer.

According to the above-mentioned invention, the second semiconductor chip and the third semiconductor chip for testing are mounted on the first semiconductor chip via the redistribution layer. The third semiconductor chip has a test circuit used for testing the first and second semiconductor chips. Accordingly, the test circuit can be easily incorporated into the semiconductor device. Additionally, there is no need to extend all of the electrodes of the first and second semiconductor chips toward the outside of the semiconductor device, and only input and output terminals connected to the test circuit may be provided to the semiconductor device. Thus, the test circuit can be incorporated into the semiconductor device without increasing the size of the semiconductor device.

Additionally, the above objects of the present invention are also achieved by a method of producing a stacked semiconductor device, comprising the steps of:

forming protruding electrodes on a first semiconductor chip;

mounting the first semiconductor chip on a second substrate by flip-chip bonding;

securing a second semiconductor chip, which is smaller than the second substrate, to a side of the second substrate opposite to a side on which the first semiconductor chip is mounted, and securing the first semiconductor chip to a front surface of a first substrate;

connecting the first and second semiconductor chips to the first substrate by wire bonding;

encapsulating the first and second semiconductor chips and the second substrate on the first substrate; and forming external connecting electrodes on a back surface of the first substrate.

According to the above-mentioned method, the first semiconductor chip is mounted on the second substrate by flip-chip bonding, so that the electrodes of the first semiconductor chip can be electrically connected to the bonding pads formed on the opposite side of the second substrate. The bonding pads are connected to the first substrate by wire bonding, so that the first semiconductor chip can be electrically connected to the first substrate. The second semiconductor chip is secured onto the second substrate, with the electrodes thereof facing upward, so that the second semiconductor chip can be connected directly to the first substrate.

Additionally, the above objects of the present invention are also achieved by a method of producing a stacked semiconductor device, comprising the steps of:

securing a first semiconductor chip onto a front surface of a first substrate;

securing a second substrate onto the first semiconductor chip;

securing a second semiconductor chip, which is smaller than the first semiconductor chip, onto the second substrate;

connecting the second semiconductor chip to the second substrate by wire bonding;

connecting the second substrate and the first semiconductor chip to the first substrate by wire bonding;

encapsulating the first and second semiconductor chips and the second substrate on the first substrate; and forming external connecting electrodes on a back surface of the first substrate.

According to the above-mentioned method, the second semiconductor chip is connected to the second substrate by wire bonding, while the first semiconductor chip is connected to the first substrate. Accordingly, even if the second semiconductor chip is much smaller than the first semiconductor chip, the second semiconductor chip can be electrically connected to the first substrate without increasing the length of the bonding wires.

Other objects, features and advantages of the present invention will become more apparent from the following description when read in conjunction with the accompanying drawings.

BRIEF DESCRIPTION OF THE DRAWINGS

FIGS. 12A to 12E illustrate the production processes of the stacked semiconductor device in accordance with the second embodiment of the present invention;

FIG. 16A is a plan view of an interior (a quarter part) of a third variation of the semiconductor device shown in FIG. 13; FIG. 16B is a cross-sectional view taken along a line XVI—XVI of FIG. 16A;

FIG. 17A is a plan view of an interior (a quarter part) of a fourth variation of the semiconductor device shown in FIG. 13; FIG. 17B is a cross-sectional view taken along a line XVII—XVII of FIG. 17A;

DESCRIPTION OF THE PREFERRED EMBODIMENTS

The following is a description of embodiments of the present invention, with reference to the accompanying drawings.

Referring now to FIGS. 3 and 4A to 4F, a first embodiment of the present invention will be described below.

Figure 1:
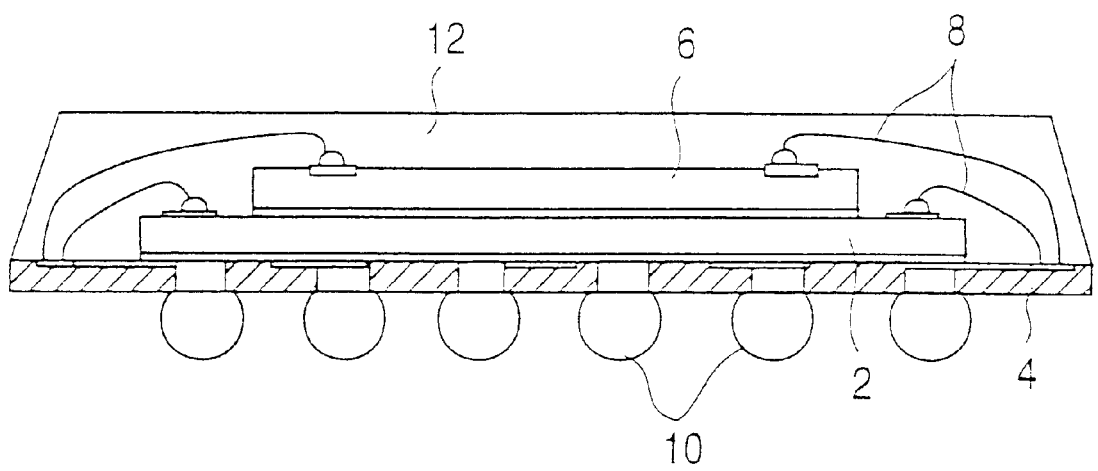
FIG. 1 shows the structure of a conventional S-MCP in which two semiconductor chips are stacked.
Figure 2B:
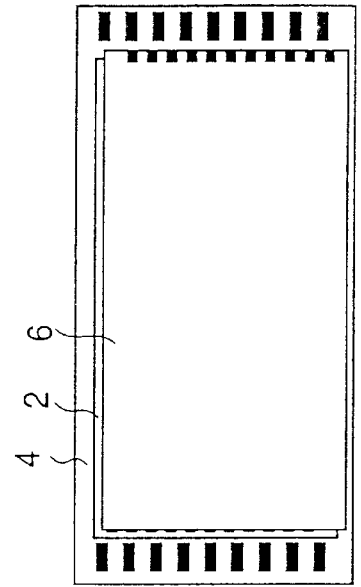
FIGS. 2A to 2D show the positional relationship between the upper semiconductor chip and the lower semiconductor chip in the conventional S-MCP.
Figure 2D:
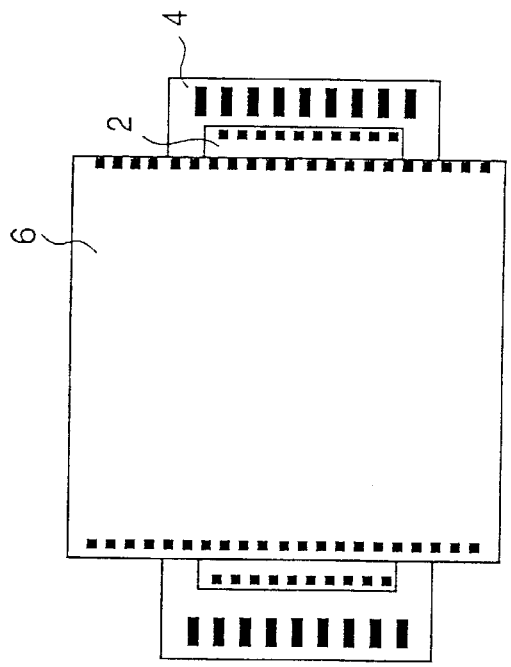
Figure 2A:
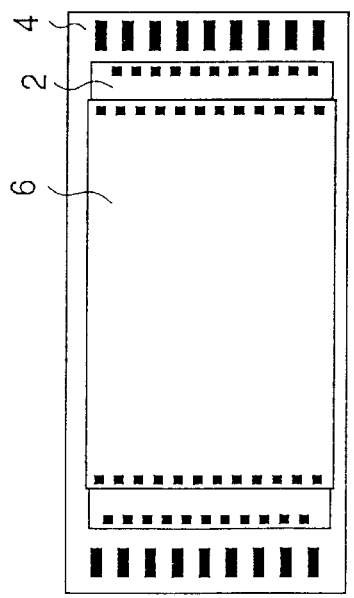
Figure 2C:
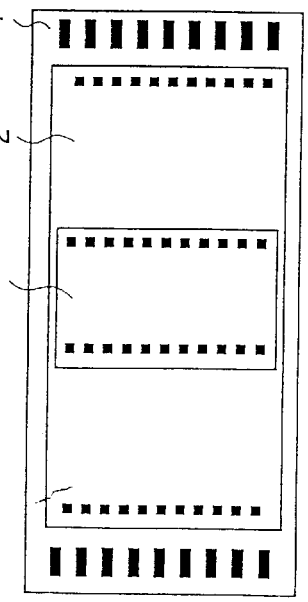
Figure 3:
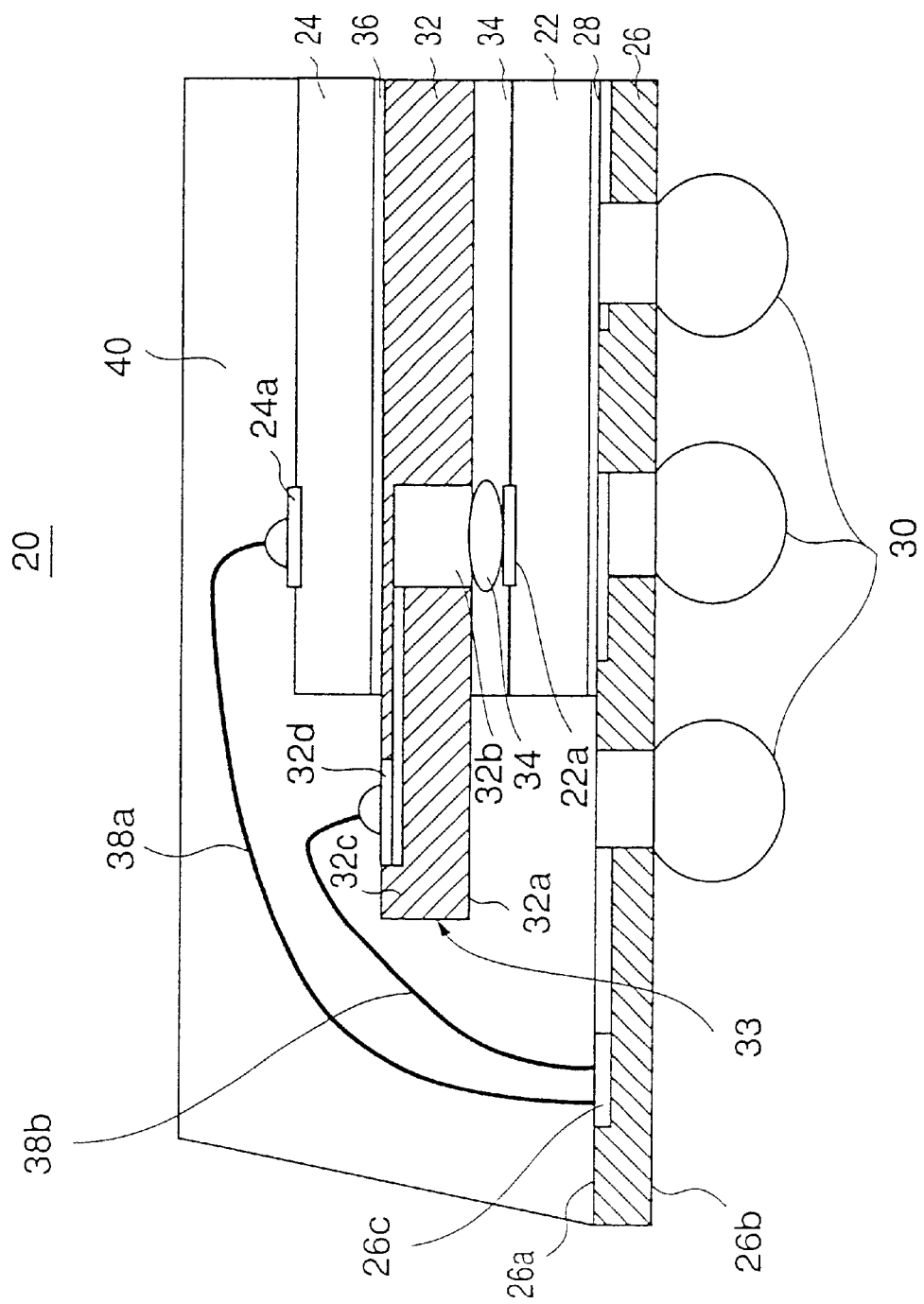
FIG. 3 is a sectional view of a part of a stacked semiconductor device in accordance with a first embodiment of the present invention.

As shown in FIG. 3, a semiconductor device 20 of the first embodiment of the present invention comprises two semiconductor chips 22 and 24 of the same type that are laminated and packaged. The lower semiconductor chip 22 is mounted on a flexible printed circuit board 26 as a first substrate, with the surface provided with electrodes facing upward. Accordingly, the backside face of the semiconductor chip 22 is bonded to the flexible printed wiring board 26 by an adhesive 28.

The flexible printed wiring board 26 is larger than the semiconductor chip 22, and has bonding pads 26c on the surface 26a on which the semiconductor chip 22 is mounted. The bonding pads 26c are electrically connected to soldering balls 30 formed as external connecting protruding electrodes on the reverse surface 26b of the flexible printed wiring board 26.

A printed circuit board 32 as a second substrate is placed on the semiconductor chip 22, and the semiconductor chip 22 is attached to the printed circuit board 32 by flip-chip bonding. More specifically, protruding electrodes (bumps) 34 are formed on electrodes 22a of the semiconductor chip 22, and the protruding electrodes 34 are connected to electrode pads 32b formed on the reverse surface 32a of the printed circuit board 32 by flip-chip bonding. On the surface 32c of the printed circuit board 32, bonding pads 32d are formed and electrically connected to the electrode pads 32b. Accordingly, the electrodes 22a of the semiconductor chip 22 are electrically connected to the bonding pads 32d via the protruding electrodes 34 and the electrode pads 32b.

The semiconductor chip 24 is fixed onto the surface 32 of the printed circuit board 32 by an adhesive 36, with the surface provided with electrodes 24a facing upward. The electrodes 24a of the semiconductor chip 24 are electrically connected to the bonding pads 26c of the flexible printed wiring board 26 by bonding wires 38a. The bonding pads 32d of the printed circuit board 32 are electrically connected to the bonding pads 26c of the flexible printed wiring board 26 by bonding wires 38b.

As described above, the stacked semiconductor chips 22 and 24, as well as the bonding wires 38a and 38b, are encapsulated by an encapsulation resin 40, thereby forming the packaged semiconductor device 20.

Since the electrodes 22a of the semiconductor chip 22 are electrically connected to the bonding pads 32d via the protruding electrodes 34 and the electrode pads 32b, the electrodes 22a of the semiconductor chip 22 and the electrodes 24a of the semiconductor chip 24 are electrically connected to the bonding pads 26c of the flexible printed wiring board 26. Accordingly, the electrodes 22a of the semiconductor chip 22 and the electrodes 24a of the semiconductor chip 24 are electrically connected to the soldering balls 30 via the bonding pads 26c.

In the above structure, the printed circuit board 32 interposed as the second substrate between the semiconductor chips 22 and 24 is larger than the upper semiconductor chip 24 so as to prevent the upper semiconductor chip 24 from covering the bonding pads 32d. The printed circuit board 32 as the second substrate has an extending portion 33 extending from the outer periphery of the upper semiconductor chip 24, and the bonding pads 32d are formed at the extending portion 33.

Being of the same type, the semiconductor chips 22 and 24 are equal in size. Accordingly, the semiconductor chips 22 and 24 are placed at the same locations as the surface 32c and the reverse surface 32a of the printed circuit board 32, so that the center of the printed circuit board 32 is sandwiched by the semiconductor chips 22 and 24, with only the outer peripheral portions extending from the outer peripheries of the semiconductor chips 22 and 24. The bonding pads 32d for connecting with the electrodes 22a of the semiconductor chip 22 are located at the extending portion 33 of the printed circuit board 32.

When the bonding wires 38a are connected to the bonding pads 32d of the printed circuit board 32, the capillary of a wire bonder needs to be placed immediately above the bonding pads 32d. Therefore, the length of the extending portion 33 of the printed circuit board 32 has to be long enough to place the capillary immediately above the bonding pads 32d.

When the bonding wires 38a are connected to the bonding pads 23d, the end portions of bonding wires extending from the capillary are pressed against the bonding pads 32d. Since the extending portion 33 of the printed circuit board 32 is not supported from below, the extending length should preferably small so as to prevent deformation and damage by the pressing force of the bonding wires extending from the capillary.

In view of this, the extending length of the printed circuit board 32 extending from the semiconductor chips 22 and 24 is set to such a length that the capillary can be arranged, and that the extending portion 33 of the printed circuit board 32 can be prevented from being damaged by the pressing force at the time of wire bonding. Also, the material of the printed circuit board 32 should have enough rigidity to endure a certain pressing force.

The bonding pads 26c, to which the bonding wires 38a and 38b are connected, are formed on the flexible printed wiring board 26. Since the bonding pads 26c should be placed in an outer region of the printed circuit board 32, the flexible printed wiring board 26 needs to be larger than the printed circuit board 32.

Referring now to FIGS. 4A to 4F, the production processes of the stacked semiconductor device 20 of the first embodiment will be described below.

Figure 4A:
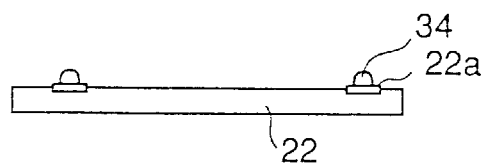
FIGS. 4A to 4F illustrate production processes of the stacked semiconductor device in accordance with the first embodiment of the present invention.
Figure 4B:
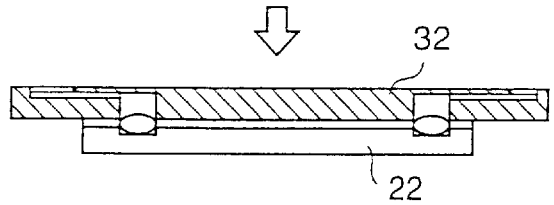

To produce the stacked semiconductor device 20, the bumps 34 are first formed at the electrodes 22a of the lower semiconductor chip 22, as shown in FIG. 4A. The semiconductor chip 22 is then mounted on the printed circuit board 32 by flip-chip bonding, as shown in FIG. 4B.

Figure 4C:
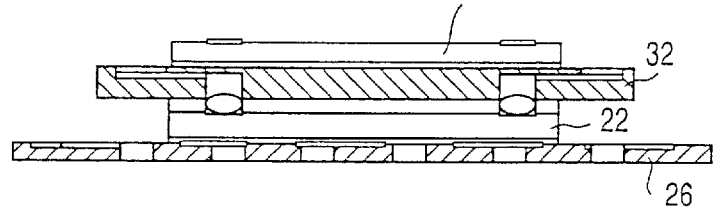

Next, as shown in FIG. 4C, the reverse face of the lower semiconductor chip 22 is bonded to the surface 26a of the flexible printed wiring board 26 by the adhesive 28, and the upper semiconductor chip 24 is bonded to the surface 32c of the printed circuit board 32 in conformity with the position of the lower semiconductor chip 22 by the adhesive 36.

Figure 4D:
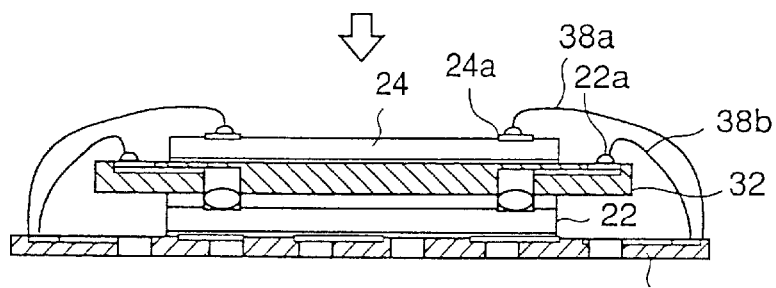

As shown in FIG. 4D, the electrodes 22a of the semiconductor chip 22 are connected to the bonding pads 26c by the bonding wires 38b, and the electrodes 24a of the semiconductor chip 24 are connected to the bonding pads 26c by the bonding wires 38a. Here, the semiconductor chips 22 and 24 are of the same type, as mentioned later, and any electrode that can be commonly used between the semiconductor chips 22 and 24 is connected to the same bonding pad 26c.

Figure 4E:
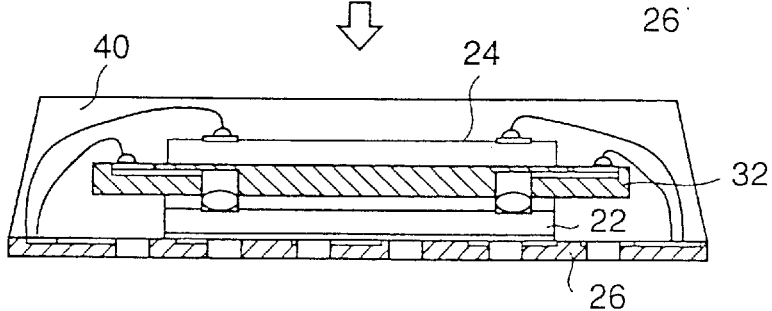
Figure 4F:
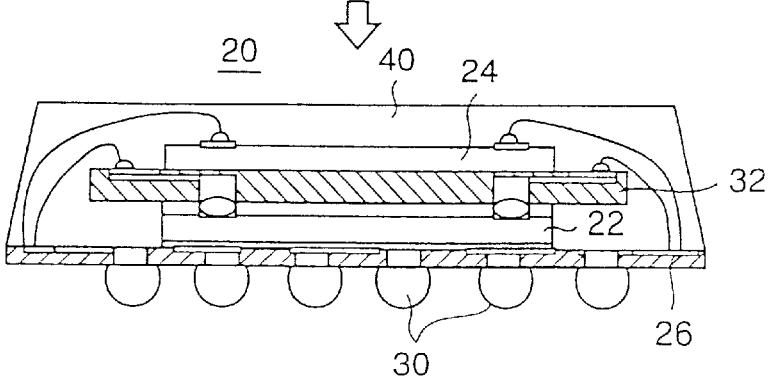

As shown in FIG. 4E, the semiconductor chips 22 and 24, as well as the bonding wires 38a and 38b, are encapsulated by the encapsulation resin 40. Ss shown in FIG. 4F, the soldering balls 30 are formed as the external connecting protruding electrodes on the reverse face 26b of the flexible printed wiring board 26, thereby completing the stacked semiconductor device 20.

In the stacked semiconductor device 20 of this embodiment, the lower semiconductor chip 22 and the upper semiconductor chip 24 are of the same type and the same size. The printed circuit board 32 interposed as the second substrate between the semiconductor chips 22 and 24 helps to connects the electrodes 22a of the lower semiconductor chip 22 to the bonding pads 26c of the flexible printed wiring board 26 as the first substrate. By this simple addition of the printed circuit board 32, semiconductor chips of the same type can be stacked and packaged into one semiconductor device.

Figure 5:
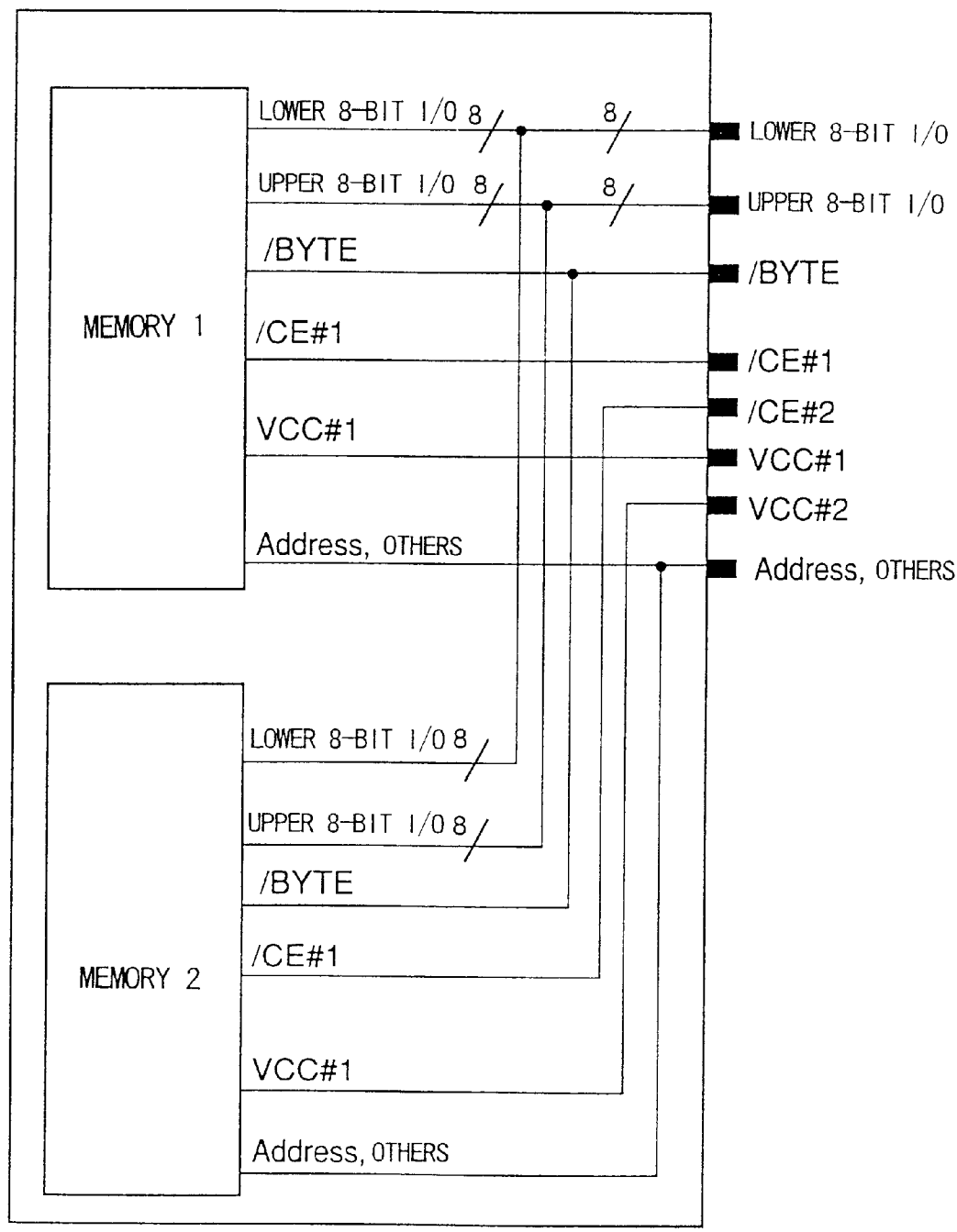
FIG. 5 shows a wiring example in which the two semiconductor chips in the semiconductor device of the first embodiment are memory chips of the same type.

FIG. 5 shows a wiring example in which the semiconductor chips 22 and 24 are memory chips of the same type (I/O configuration: 8 bits×2=16 bits). With the wiring structure shown in FIG. 5, the memory capacity can be doubled without making any change to the I/O configuration. In FIG. 5, a memory 1 represents a memory chip equivalent to the lower semiconductor chip 22, and a memory 2 represents a memory chip equivalent to the upper semiconductor chip 24. Although the memory 2 is actually placed on the memory 1, the memory 1 and the memory 2 are aligned in FIG. 2 for ease of explanation.

The memory 1 and the memory 2 each have a lower 8-bit I/O terminal, an upper 8-bit I/O terminal, a /BYTE terminal, an Address terminal, and other terminals. The memory 1 further includes a /CE#1 terminal (a chip enable terminal) and a VCC#2 terminal, while the memory 2 further includes a /CE#2 terminal (a chip enable terminal) and a VCC#2 terminal. Among these terminals, the lower 8-bit I/O terminal, the upper 8-bit I/O terminal, the /BYTE terminal, the Address terminal, and the other terminals can receive signals common to both the memory 1 and the memory 2. Accordingly, the lower 8-bit I/O terminal, the upper 8-bit I/O terminal, the /BYTE terminal, the Address terminal, and the other terminals are connected to the same external connecting terminals (soldering balls) 30 of the semiconductor device 20. Thus, the corresponding terminals between the memory 1 and the memory 2 are connected to the same bonding pads 26c of the flexible printed wiring board 26 by the bonding wires 38a and 38b.

Meanwhile, among those terminals, the /CE#1 terminals (the chip enable terminal) and the VCC#1 terminals of the memory 1 are connected to external connecting terminals different from the external connecting terminals to which the /CE#2 terminal (the chip enable terminal) and the VCC#2 terminal are connected, so that the memory 1 and the memory 2 can be controlled independently of each other. Since the chip enable terminals of the memory 1 and the memory 2 receive signals independently of each other, the chip enable terminals are connected to different external connecting terminals. The /CE#1 terminal of the memory 1 is connected to a /CE#1 terminal of the semiconductor device 20, while the /CE#2 terminal of the memory 2 is connected to a /CE#2 terminal of the semiconductor device 20, so as to receive separate signals. The VCC#1 terminal of the memory 1 and the VCC#2 terminal of the memory 2 may be connected to a common external connecting terminal, but the VCC#1 terminal and the VCC#2 terminal are connected in separate external connecting terminals in this embodiment.

Figure 6:
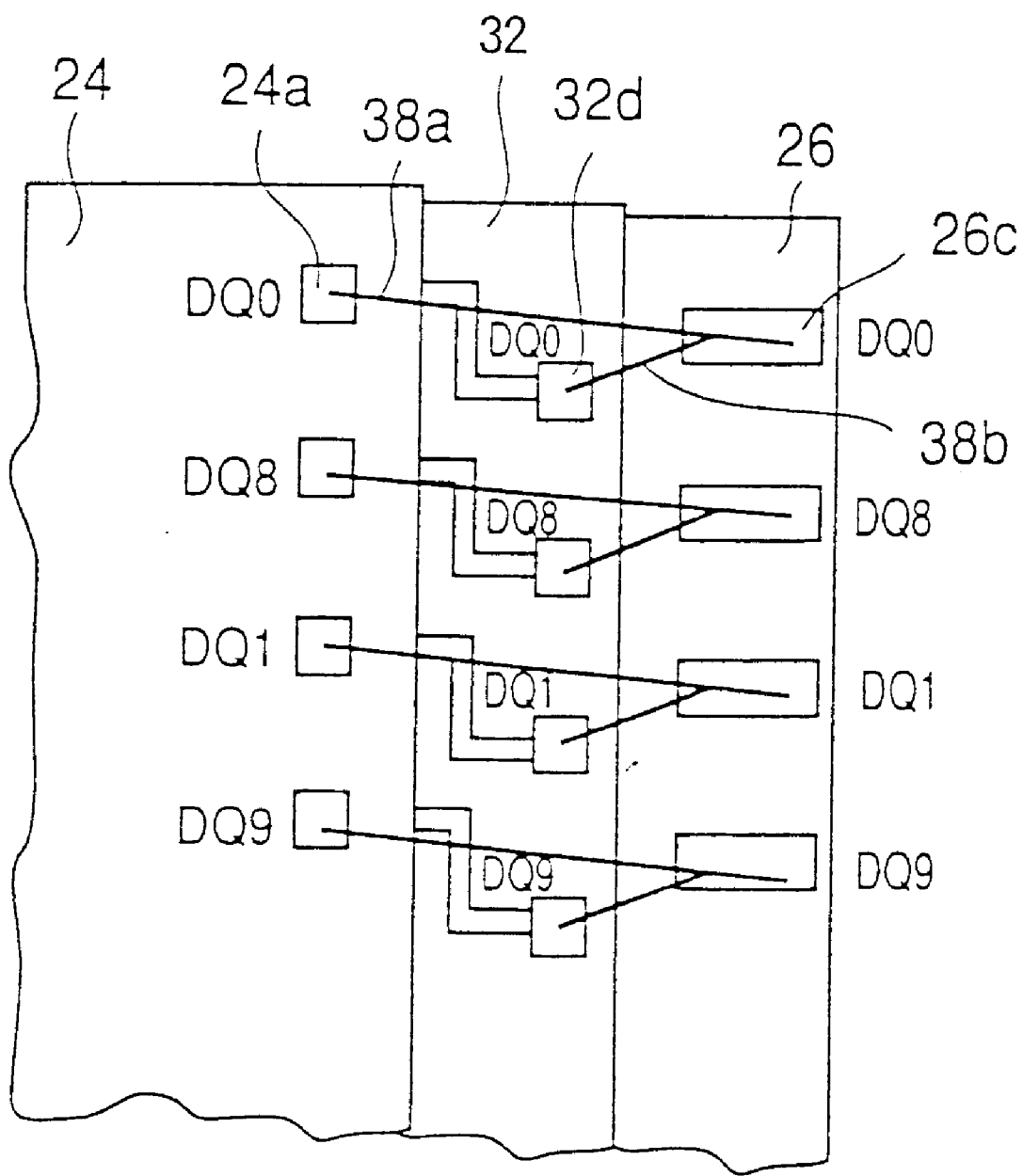
FIG. 6 is a schematic view of a part of bonding wires that embody the wiring example shown in FIG. 5.

FIG. 6 is a schematic view of a part of the bonding wires that embody the wiring example shown in FIG. 5. In FIG. 6, terminals DQ0, DQ8, DQ1, and DQ9 among the lower 8-bit I/O terminals (equivalent to the electrodes 24a) of the upper memory 1 are shown. The bonding pads 32d connected to terminals DQ0, DQ8, DQ1, and DQ9 of the lower memory 2 are shown on the printed circuit board 32 as the second substrate.

The terminals DQ0, DQ8, DQ1, and DQ9 of the memory 1 and the memory 2 can receive common signals, and can be connected to the same terminals of the flexible printed wiring board 26 as the first substrate. For instance, the terminal DQ0 of the upper memory 1 and the bonding pad connected to the terminal DQ0 of the lower memory 2 are connected to the same bonding pad 26c of the flexible printed wiring board 26.

The bonding wire 38a that connects the terminal DQ0 of the upper memory 1 and one of the bonding pads 26c deviates in the height direction from the bonding wire 38b that connects the bonding pad 32d connected to the terminal DQ2 of the lower memory 2 and the bonding pad 26c, so as to prevent contact between the bonding wires 38a and 38b, as shown in FIG. 3. In the example shown in FIG. 6, the location of each bonding pad 32d deviates in the horizontal direction from the bonding wires 38a, so that the contact between the bonding wires 38a and 38b can be surely prevented.

Figure 7:
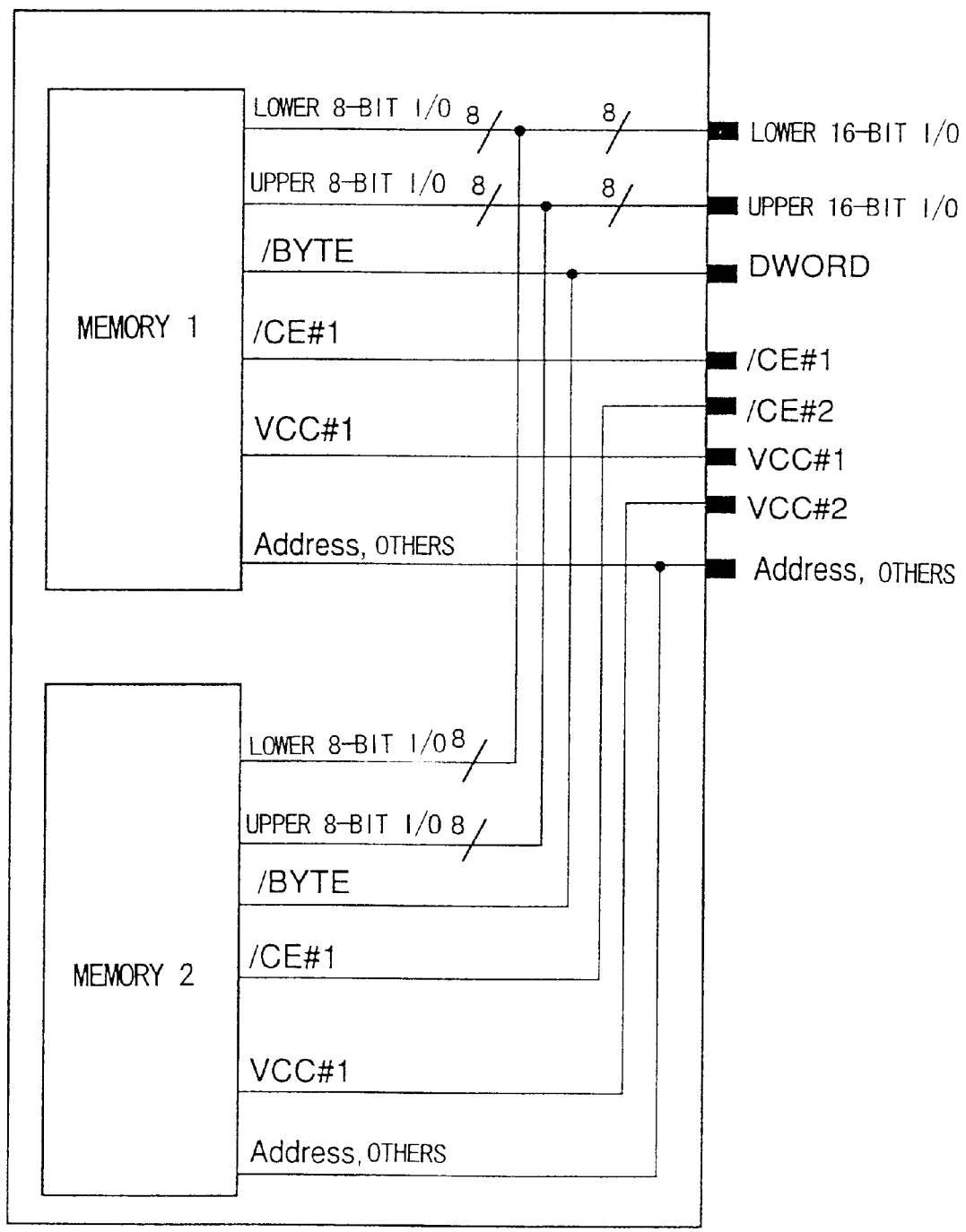
FIG. 7 shows a wiring example in which a change is made to the wiring example of FIG. 5 and the I/O configuration is doubled.

FIG. 7 shows an example in which a change is made to the wiring in the memory 1 and the memory 2, and the I/O configuration is doubled. More specifically, in the wiring example shown in FIG. 7, the lower 8-bit I/O terminals and the upper 8-bit I/O terminals are not commonly connected, but separately connected to different external connecting terminals (soldering balls) of the semiconductor device 20. Accordingly, the lower 8-bit I/O terminals and the upper 8-bit I/O terminals are connected to separate bonding pads 26c of the flexible printed wiring board 26 by the bonding wires 38a and 38b.

In case only one of the memory 1 and the memory 2 is used, the /CE#1 terminal (the chip enable terminal) and the VCC#1 terminal of the memory 1 are connected to external connecting terminals that are different from the external connecting terminals to which the /CE#2 terminal (the chip enable terminal) and the VCC#2 terminal of the memory 2. Also, the /BYTE terminal is connected in the package as a DWORD terminal to one terminal. The DWORD terminal functions to switch the I/O configuration between a 16-bit configuration and a 32-bit configuration. The rest of the terminals can be connected to common external connecting terminals.

Figure 8:
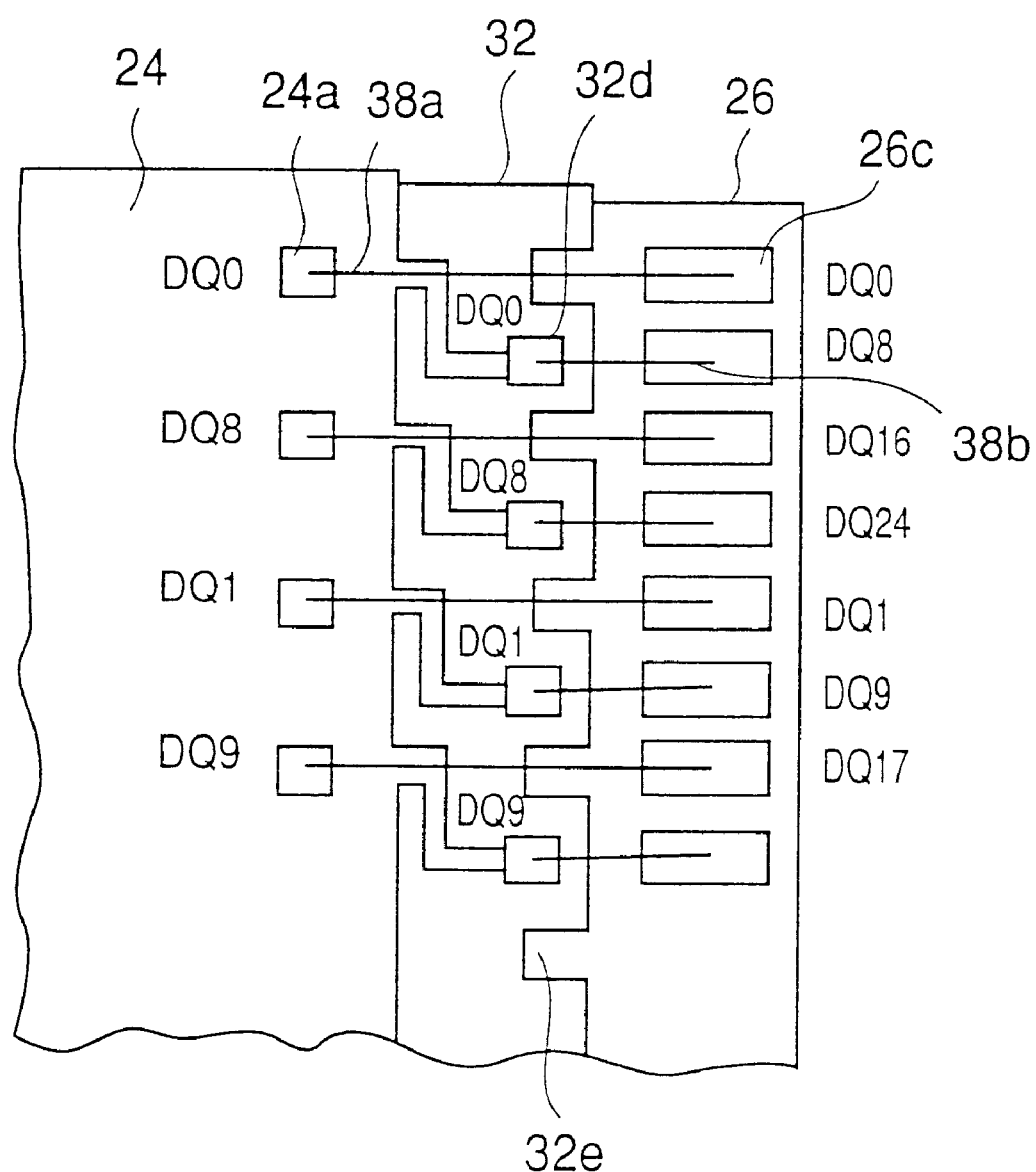
FIG. 8 is a schematic view of a part of bonding wires that embody the wiring example shown in FIG. 7.

FIG. 8 is a schematic view of a part of the bonding wires that embody the wiring example shown in FIG. 7. In FIG. 8, the terminals DQ0, DQ8, DQ1, and DQ9 among the lower 8-bit I/O terminals (equivalent to the electrodes 22a) of the upper memory 1 are shown. On the printed circuit board 32 as the second substrate, the bonding pads 32d connected to the terminals DQ0, DQ8, DQ1, and DQ9 of the lower memory 2 are shown.

Since the terminals DQ0, DQ8, DQ1, and DQ9 of the memory 1 and the memory 2 receive separate signals, they are connected to different boning pads. For instance, the terminal DQ0 of the upper memory 1 is connected as a DQ terminals to one of the bonding pad 26c of the flexible printed wiring board 26, while the bonding pad connected to the DQ0 terminal of the lower memory 2 is connected as a DQ8 terminal to another one of the bonding pads 26c.

The bonding wire 38a that connects the terminal DQ0 of the upper memory 1 and the corresponding bonding pad 26c and the bonding wire 38b that connects the bonding pad 32d connected to the terminal DQ0 of the lower memory 2 and the bonding pad 26c corresponding to the terminal DQ8 are arranged in such a manner that the bonding pad 32d deviates in the horizontal direction from the bonding wires 38a and 38b. In this manner, the bonding wires 38a and 38b are situated in parallel with each other, and contact between the bonding wires 38a and 38b can be prevented.

The bonding wire 38a that connects the terminals (electrodes) of the upper memory 1 and the bonding pads 26c of the flexible printed wiring board 26 should be located so as not to be brought into contact with the printed circuit board 32. In the example shown in FIG. 8, the printed circuit board 32 is provided with the notches 32e, so that the bonding wires 38a extends along the notches 32e. In this structure, the bonding wires 38a can be shortened, and the contact of the bonding wires 38a with the surrounding components can be prevented. Also, the contact of the capillary of wire bonding device with the printed circuit board 32 can be prevented.

Figure 9A:
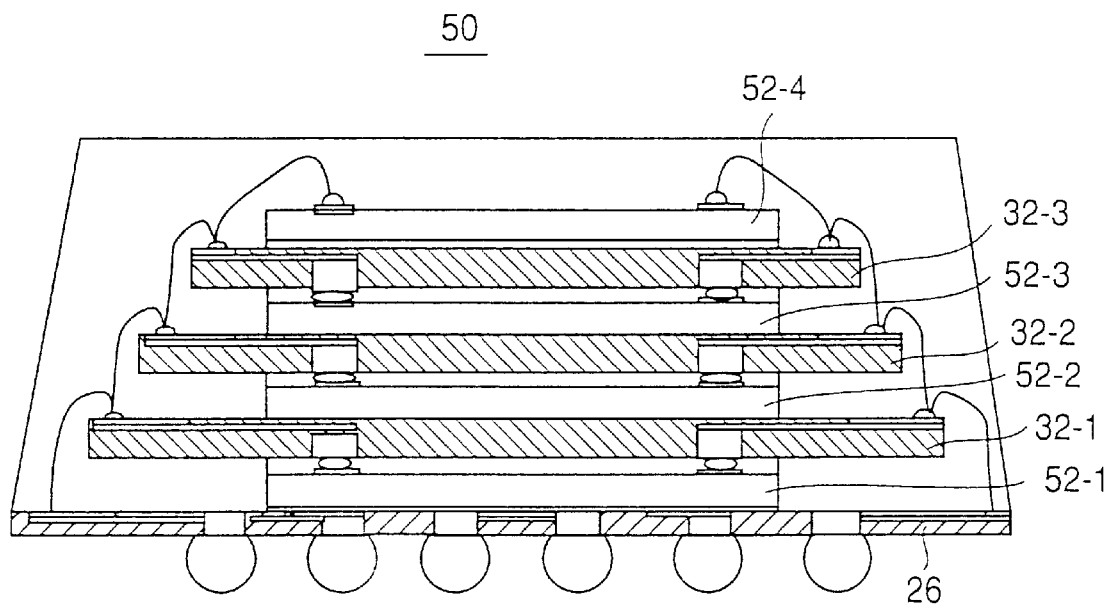
FIGS. 9A and 9B show semiconductor devices in each of which a plurality of semiconductor chips are stacked in accordance with the first embodiment of the present invention.
Figure 9B:
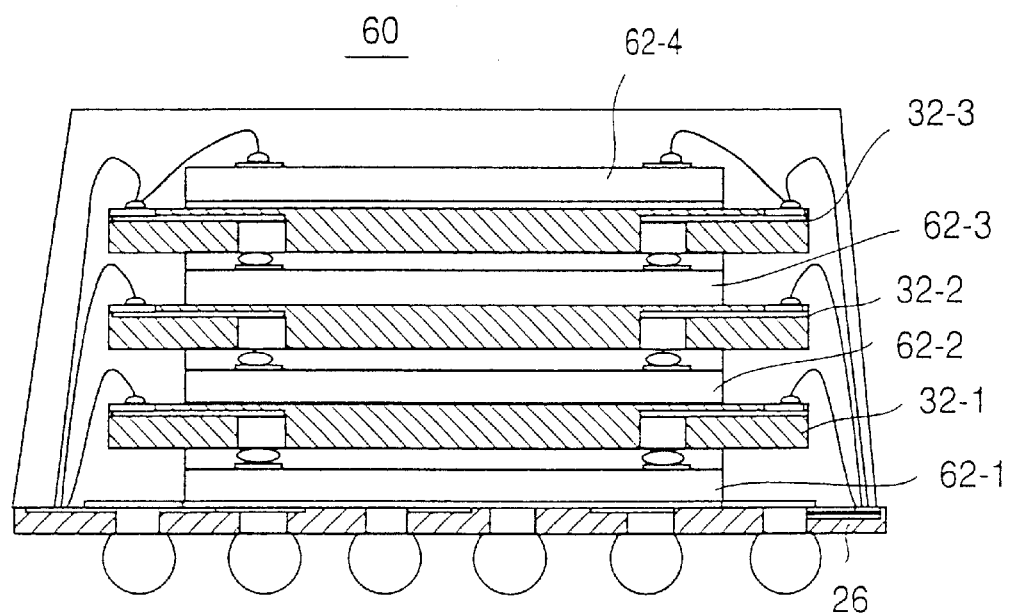

FIGS. 9A and 9B show examples in each of which a plurality of semiconductor chips are stacked in accordance with the first embodiment of the present invention. In each of the two examples, four semiconductor chips of the same type are stacked, and second substrates are interposed between the semiconductor chips. At the end of the stacking process, only the electrodes of the uppermost semiconductor chip are exposed, and the other semiconductor chips are mounted on the second substrates (the printed circuit boards 32) by flip-chip bonding.

A semiconductor device 50 shown in FIG. 9A comprises four semiconductor chips 52-1 to 52-4 of the same type that are stacked and then connected to one another by wire bonding. This wire bonding process is performed first between the uppermost semiconductor chip 52-4 and the uppermost second substrate 32-3, and then performed between the uppermost second substrate 32-3 and the second substrate 32-2 immediately below the second substrate 32-3. In this manner, the wire bonding process is successively performed until the wire bonding between the lowermost second substrate 32-1 and the first substrate (the flexible printed wiring board 26). To perform collectively the wiring bonding process, each second substrate needs to be larger than the second substrate located immediately above, so as to prevent the bonding pads from being covered by the upper second substrate.

In a semiconductor device 60 shown in FIG. 9B, semiconductor chips 62-1 to 62-4 are stacked one by one, and the wire bonding process is performed for the each stacking process. More specifically, the lowermost semiconductor chip 62-1 is mounted on the first substrate (the flexible printed wiring board 26), and the lowermost second substrate 32-1 is then mounted on the lowermost semiconductor chip 62-1 by flip-chip bonding. At this point, a wire bonding process is performed between the second substrate 32-1 and the first substrate 26. Next, the second lowermost semiconductor chip 62-2 is secured onto the lowermost second substrate 32-1, and the second lowermost second substrate 32-2 is mounted on the semiconductor chip 62-2 by flip-chip bonding. A wire bonding process is then performed between the second lowermost second substrate 32-2 and the first substrate 26. In this manner, a wire bonding process is performed every time one second substrate is stacked on one semiconductor chip. When the uppermost semiconductor chip 62-4 is stacked on and connected to the uppermost second substrate 32-3 by wire bonding, all the wire bonding processes are completed. In this structure, all the second substrates can have the same size.

In the above embodiment, the electrodes to be connected by wires are arranged along the two opposite sides of each semiconductor chip. However, it is also possible to arrange the electrodes along the four sides of each semiconductor chip. Also, each second substrate (the printed circuit board 32) should preferably be made of a material having rigidity, but a flexible printed wiring board maybe employed so as to reduce the width of the package, as long as enough substrate strength can be maintained.

Next, a stacked semiconductor device in accordance with a second embodiment of the present invention will be described.

Figure 10:
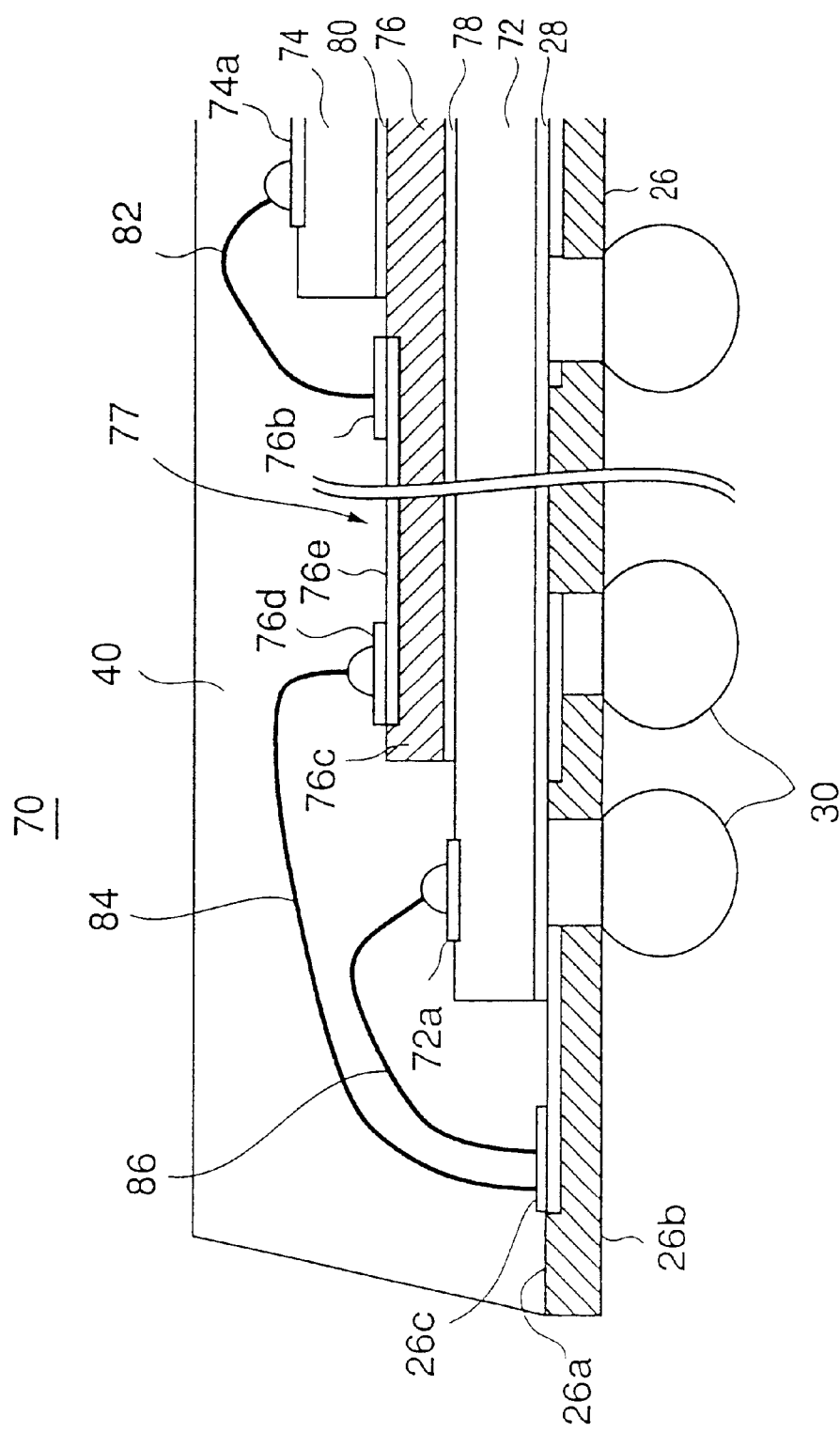
FIG. 10 is a sectional view of a part of a stacked semiconductor device in accordance with a second embodiment of the present invention.
Figure 11:
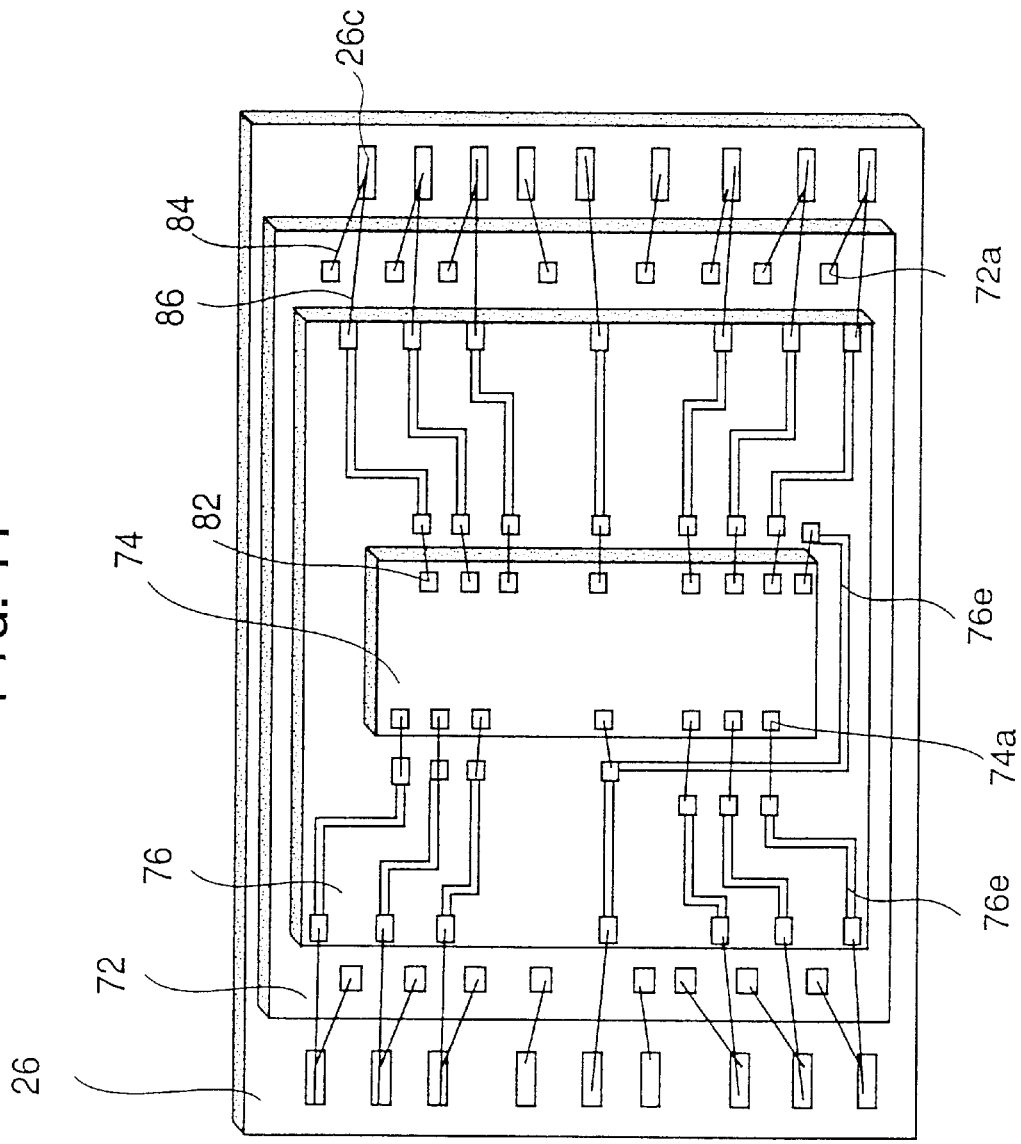
FIG. 11 is a perspective view showing the stacked structure of the stacked semiconductor device in accordance with the second embodiment of the present invention.

FIG. 10 is a sectional view of a part of the stacked semiconductor device in accordance with the second embodiment of the present invention. FIG. 11 is a perspective view showing the stacked structure of the stacked semiconductor device in accordance with the second embodiment of the present invention. FIGS. 12A to 12E show the production processes of the stacked semiconductor device in accordance with the second embodiment of the present invention. In FIGS. 10 to 12E, the same components as in FIG. 3 are denoted by the same reference numerals, and explanations for those components are omitted in the following description.

As shown in FIG. 10, a semiconductor device 70 of the second embodiment of the present invention has two semiconductor chips 72 and 74 of different sizes stacked in one package. The lower semiconductor chip 72 is mounted on the flexible printed wiring board 26 as the first substrate, with the surface provided with electrodes 72a facing downward. Thus, the reverse surface of the semiconductor chip 72 is bonded to the flexible printed wiring board 26 by the adhesive 28.

The flexible printed wiring board 26 is larger than the semiconductor chip 72 mounted thereon, and the bonding pads 26c are formed on the surface 26a on which the semiconductor chip 72 is mounted. The bonding pads 26c are electrically connected to the soldering balls 30 formed as external connecting protruding electrodes on the reverse surface 26b of the flexible printed wiring board 26.

A flexible printed wiring board 76 is placed as a second substrate on the semiconductor chip 72, and secured there by an adhesive 78. Bonding pads 76d and 76b are formed on the surface 76c of the flexible printed wiring board 76. The bonding pads 76d are formed at the peripheral portion of the flexible printed wiring board 76, while the bonding pads 76b are arranged in a region surrounding the position in which the semiconductor chip 74 is to be placed within the area of the flexible printed wiring board 76. The bonding pads 76d are electrically connected to the corresponding bonding pads 76b by a wiring pattern 76e. The semiconductor chip 74 is secured onto the surface 76c of the flexible printed wiring board 76 by an adhesive 80, with the surface provided with electrodes 74a facing upward.

In the above stacked structure, the electrodes 74a of the upper semiconductor chip 74 are electrically connected to the bonding pads 76b of the flexible printed wiring board 76 by bonding wires 82. Meanwhile, the bonding pads 76d are connected to the bonding pads 26c of the flexible printed wiring board 26 by bonding wires 84.

As described above, since the bonding pads 76b are electrically connected to the bonding pads 76d by the wiring pattern 76e on the flexible printed wiring board 76, the electrodes 74a of the semiconductor chip 74 are electrically connected to the bonding pads 26c of the flexible printed wiring board 26 via the bonding wires 82, the bonding pads 76b, the wiring pattern 76e, the bonding pads 76d, and the bonding wires 84.

Meanwhile, the electrodes 72a of the lower semiconductor chip 72 is electrically connected to the bonding pads 26c of the flexible printed wiring board 26 by bonding wires 86.

The semiconductor chips 72 and 74 stacked as described above are encapsulated by the encapsulation resin 40, together with the bonding wires 82, 84, and 86, thereby constituting the packaged semiconductor device 70.

As described above, the electrodes 72a of the semiconductor chip 72 and the electrodes 74a of the semiconductor chip 74 are electrically connected to the bonding pads 26c of the flexible printed wiring board 26. Accordingly, the electrodes 72a of the semiconductor chip 72 and the electrodes 74a of the semiconductor chip 74 are electrically connected to the soldering balls 30 as the external connecting terminals via the bonding pads 26c.

In the above stacked structure, the flexible printed wiring board 76 formed as the second substrate on the lower semiconductor chip 72 is located in an inner position compared with the location of the electrodes 72a of the lower semiconductor chip 72. More specifically, the end portion of the flexible printed wiring board 76 is designed in such a manner that the capillary of a wire bonding device can be prevented from being brought into contact with the end portion of the flexible printed wiring board 76 when the wire bonding device performs a wire bonding process on the electrodes 72a.

The bonding pads 76b of the flexible printed wiring board 76 are located in positions in accordance with the size of the semiconductor chip 74. The bonding pads 76 are formed at such locations that a wire boding process can be easily performed between the bonding pads 76b and the electrodes 74a of the semiconductor chip 74. More specifically, the bonding pads 76b are formed at an extending portion 77 that extends beyond the outer periphery of the upper semiconductor chip 74, so that the bonding pads 76d can be easily bonded by wires to the flexible printed wiring board 26, which is the first substrate.

The second substrate used in this embodiment is the flexible printed wiring board 76, which does not necessarily have rigidity. Since the entire second substrate is mounted on and supported by the lower semiconductor chip 72 in this embodiment, the second substrate may be flexible.

As shown in FIG. 11, although the upper semiconductor chip 74 is much smaller than the lower semiconductor chip 72 in this embodiment, the flexible printed wiring board 76, which is the second substrate, can effectively connect the electrodes 74a of the upper semiconductor chip 74 to the bonding pads 26c of the flexible printed wiring board 26, which is the first substrate.

The wiring pattern 76e of the flexible printed wiring board 76 can be designed with certain freedom. For instance, the bonding pads corresponding to the electrodes formed at one side of the semiconductor chip 76 can be pulled around to the opposite side.

Referring now to FIGS. 12A to 12E, the production processes of the semiconductor device 70 shown in FIG. 10 will be described below.

Figures 12A, 12B, 12C, 12D, 12E:
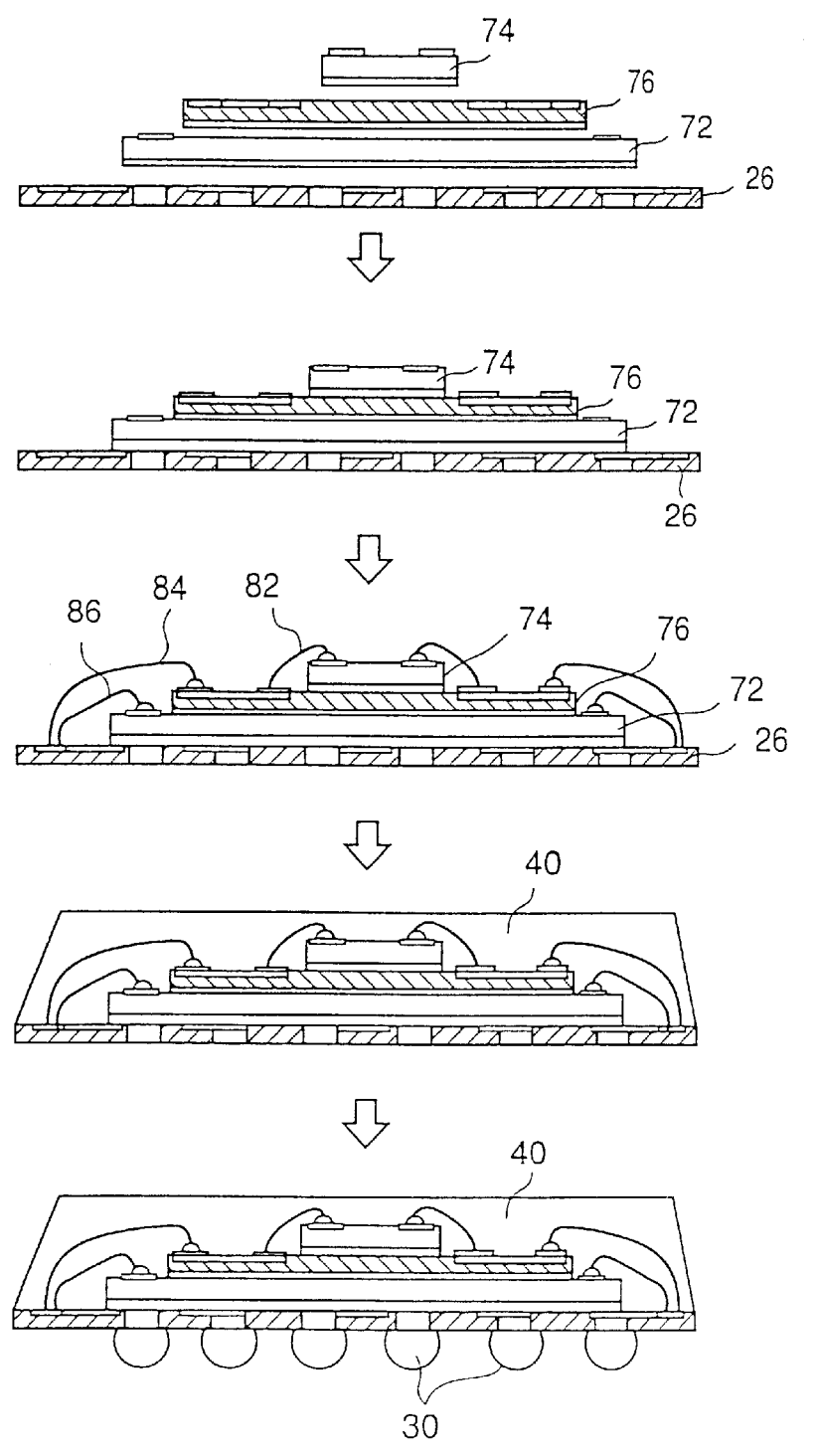

As shown in FIG. 12A, the flexible printed wiring boards 26 and 76, and the semiconductor chips 72 and 74 are prepared. As shown in FIG. 12B, the flexible printed wiring boards 26 and 76, and the semiconductor chips 72 and 74 are stacked and secured by the adhesives 28, 78, and 80.

As shown in FIG. 12C, the electrodes 74a of the upper semiconductor chip 74 are electrically connected to the bonding pads 76b of the flexible printed wiring board 76 by the bonding wires 82. Also, the electrodes 72a of the lower semiconductor chip 72 are electrically connected to the bonding pads 26c of the flexible printed wiring board 26 by the bonding wires 84. Further, the bonding pads 76d of the flexible printed wiring board 76 are electrically connected to the bonding pads 26c of the flexible printed wiring board 26 by the bonding wires 86.

After the wire bonding process, the semiconductor chips 72 and 74, together with the bonding wires 82, 84, and 86, are encapsulated by the encapsulation resin 40, as shown in FIG. 12D. As shown in FIG. 12E, the soldering balls 30 formed as the external connecting protruding electrodes on the reverse surface 26b of the flexible printed wiring board 26, thereby completing the stacked semiconductor device 70.

In the semiconductor device shown in FIG. 10, one semiconductor chip is stacked on the lower semiconductor chip via a flexible printed wiring board. However, if the upper semiconductor chip is much smaller than the lower semiconductor chip, a plurality of semiconductor chips may be stacked on the lower semiconductor chip via a flexible printed wiring board, as shown in FIG. 13.

Figure 13:
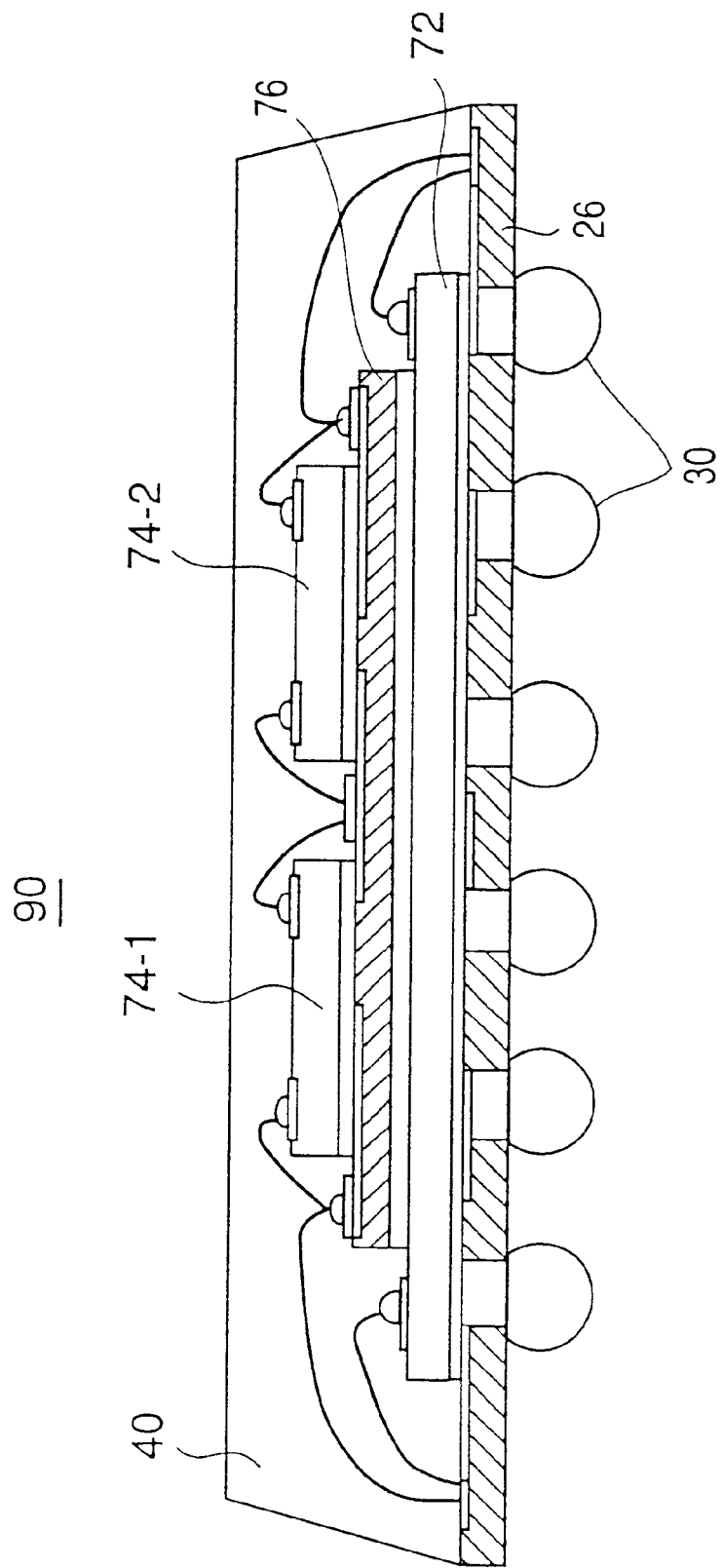
FIG. 13 is a sectional view of a semiconductor device having a plurality of upper semiconductor chips.

In a semiconductor device 90 shown in FIG. 13, two semiconductor chips 74-1 and 74-2 are placed on the lower semiconductor chip 72 via the flexible printed board 76. The structure and the method of the semiconductor device 90 are substantially the same as the semiconductor device 70 shown in FIG. 10, and explanations for those are omitted in this description.

In each of the stacked semiconductor devices 70 and 90 of this embodiment, the lower semiconductor chip 72 is much larger than the upper semiconductor chip 74 or the upper semiconductor chips 74-1 and 74-2. However, the flexible printed wiring board 76 as the second substrate formed between the lower semiconductor chip 74 and the upper semiconductor chip 74 or the upper semiconductor chips 74-1 and 74-2 connects the electrodes 72a of the lower semiconductor chip 72 to the bonding pads 26c of the flexible printed wiring board 26 as the first substrate via the flexible printed wiring board 76. Accordingly, the simple addition of the flexible printed wiring board enables a plurality of semiconductor chips of different types and sizes to be stacked and turned into one packaged.

Although the electrodes to be connected by wires are arranged along to opposite sides of each semiconductor chip in the above embodiment, it is also possible to arrange the electrodes along the four sides of each semiconductor chip.

The lower semiconductor chip 72 is connected to the flexible printed wiring board 26 by wire bonding in this embodiment. However, it is possible to form protruding electrodes on the lower semiconductor chip 72, and connect the lower semiconductor chip 72 to the flexible printed wiring board 76 by flip-chip bonding, as in the first embodiment of the present invention. In such a case, the lower semiconductor chip 72 is electrically connected to the flexible wiring board 26 via the flexible printed wiring board 76.

The second substrate of this embodiment is the flexible printed wiring board, which is flexible and can have a film-like form. However, it is possible to employ a printed circuit board made of a material having rigidity.

In the semiconductor device 90 shown in FIG. 13, not only the upper semiconductor chip but also the lower semiconductor chip can be pluralized.

Figure 14A:
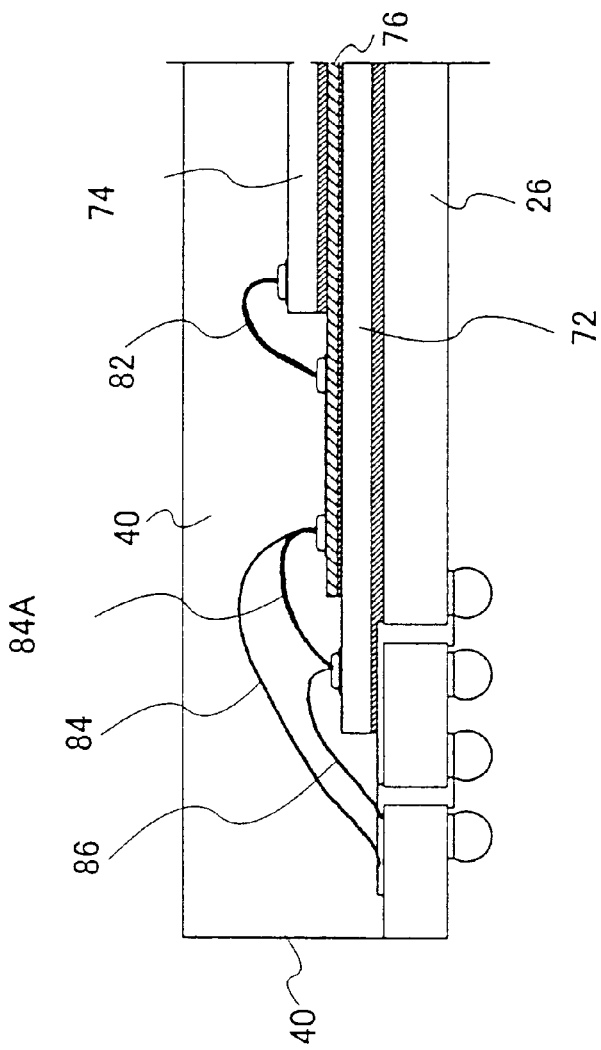
FIG. 14A is a plan view of an interior (a quarter part) of a first variation of the semiconductor device shown in FIG. 13.
Figure 14B:
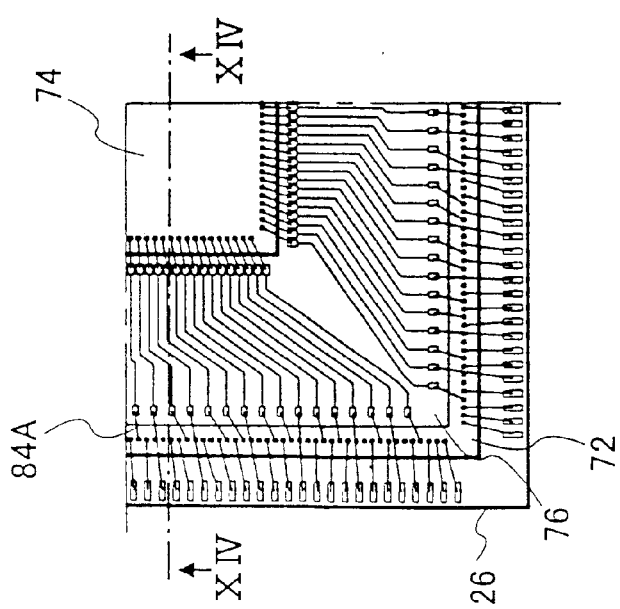
FIG. 14B is a cross-sectional view taken along a line XIV—XIV of FIG. 14A.
Figure 15A:
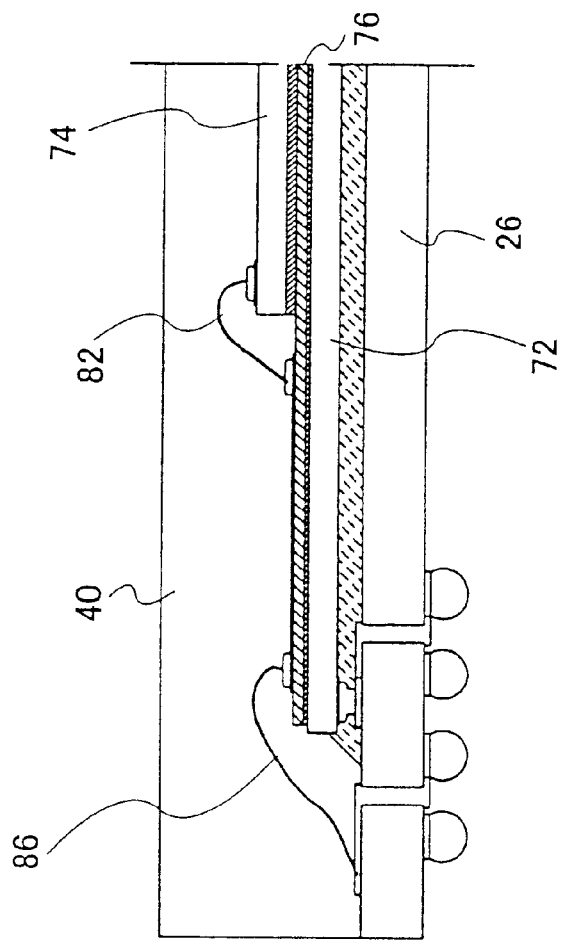
FIG. 15A is a plan view of an interior (a quarter part) of a second variation of the semiconductor device shown in FIG. 13.
Figure 15B:
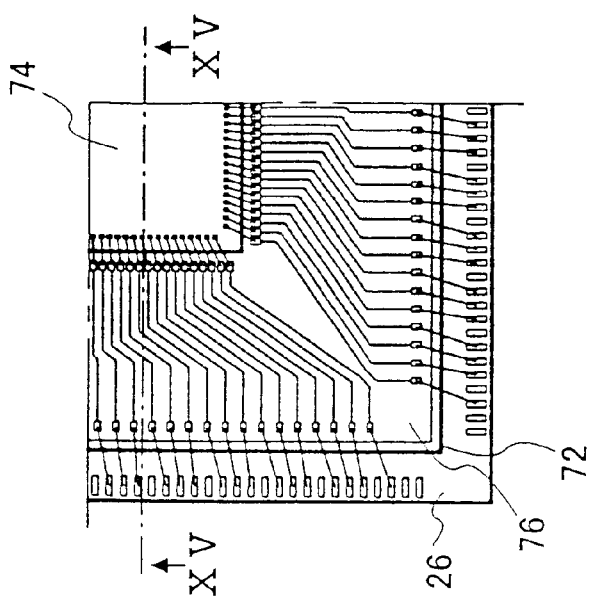
FIG. 15B is a cross-sectional view taken along a line XV—XV of FIG. 15A.

A description will now be given, with reference to FIGS. 14 through 17, of various variations of the semiconductor device according the second embodiment of the present invention shown in FIG. 10. FIGS. 14A and 14B show a first variation of the semiconductor device 90. FIG. 14A is a plan view of an interior (a quarter part) of the first variation, and FIG. 14B is a cross-sectional view taken along a line XIV—XIV of FIG. 14A. FIGS. 15A and 15B show a second variation of the semiconductor device 90. FIG. 15A is a plan view of an interior (a quarter part) of the second variation, and FIG. 15B is a cross-sectional view taken along a line XV—XV of FIG. 15A. Additionally, FIGS. 16A and 16B show a third variation of the semiconductor device 90. FIG. 16A is a plan view of an interior (a quarter part) of the third variation, and FIG. 16B is a cross-sectional view taken along a line XVI—XVI of FIG. 16A. Further, FIGS. 17A and 17B show a fourth variation of the semiconductor device 90. FIG. 17A is a plan view of an interior (a quarter part) of the fourth variation, and FIG. 17B is a cross-sectional view taken along a line XVII–XVII of FIG. 17A.

The first variation shown in FIGS. 14A and 14B has basically the same structure as the semiconductor device 70 shown in FIG. 10 except for bonding wires 84A being added so as to connect the bonding pads 76d of the flexible printed wiring board 76 to the electrodes 72a of the lower semiconductor chip 72. That is, in the first variation shown in FIG. 14, the lower semiconductor chip 72 is mounted on the flexible printed wiring board 16 in a face-up state and connected by wire-bonding, and the upper semiconductor chip 74 is mounted on the lower semiconductor chip 72 via the flexible printed wiring board 76 in a face-up state and connected by wire-bonding. The bonding wires 84A are provided to electrically connects the upper semiconductor chip 74 to the lower semiconductor chip 72. Accordingly, the length of the signal transmission path between the upper semiconductor chip 74 and the lower semiconductor chip 72 is reduced, which enables a high-speed signal transmission.

The second variation shown in FIGS. 15A and 15B has basically the same structure as the semiconductor device 70 shown in FIG. 10 except for the lower semiconductor chip 72 being mounted to the flexible printed wiring board 26 in a face-down state. That is, the lower semiconductor chip 72 is mounted to the flexible printed wiring board 26 by flip-chip bonding, and the upper semiconductor chip 74 is mounted on the lower semiconductor chip 72 via the flexible printed wiring board 76 and connected by wire-bonding.

The third variation shown in FIGS. 16A and 16B has basically the same structure as the semiconductor device 70 shown in FIG. 10 except for the upper semiconductor chip 74 being mounted to the flexible printed wiring board 76 in a face-down state. That is, the upper semiconductor chip 74 is mounted to the flexible printed wiring board 76 by flip-chip bonding, and the lower semiconductor chip 72 is mounted to the flexible printed wiring board 26 and connected by wire bonding.

The fourth variation shown in FIGS. 17A and 17B is a combination of the second variation and the third variation in which both the upper semiconductor chip 74 and the lower semiconductor chip 72 are mounted in a face-down state. That is, the upper semiconductor chip 74 is mounted to the flexible printed wiring board 76 by flip-chip bonding, and the lower semiconductor chip 72 is mounted to the flexible printed wiring board 26 also by flip-chip bonding.

Figure 18:
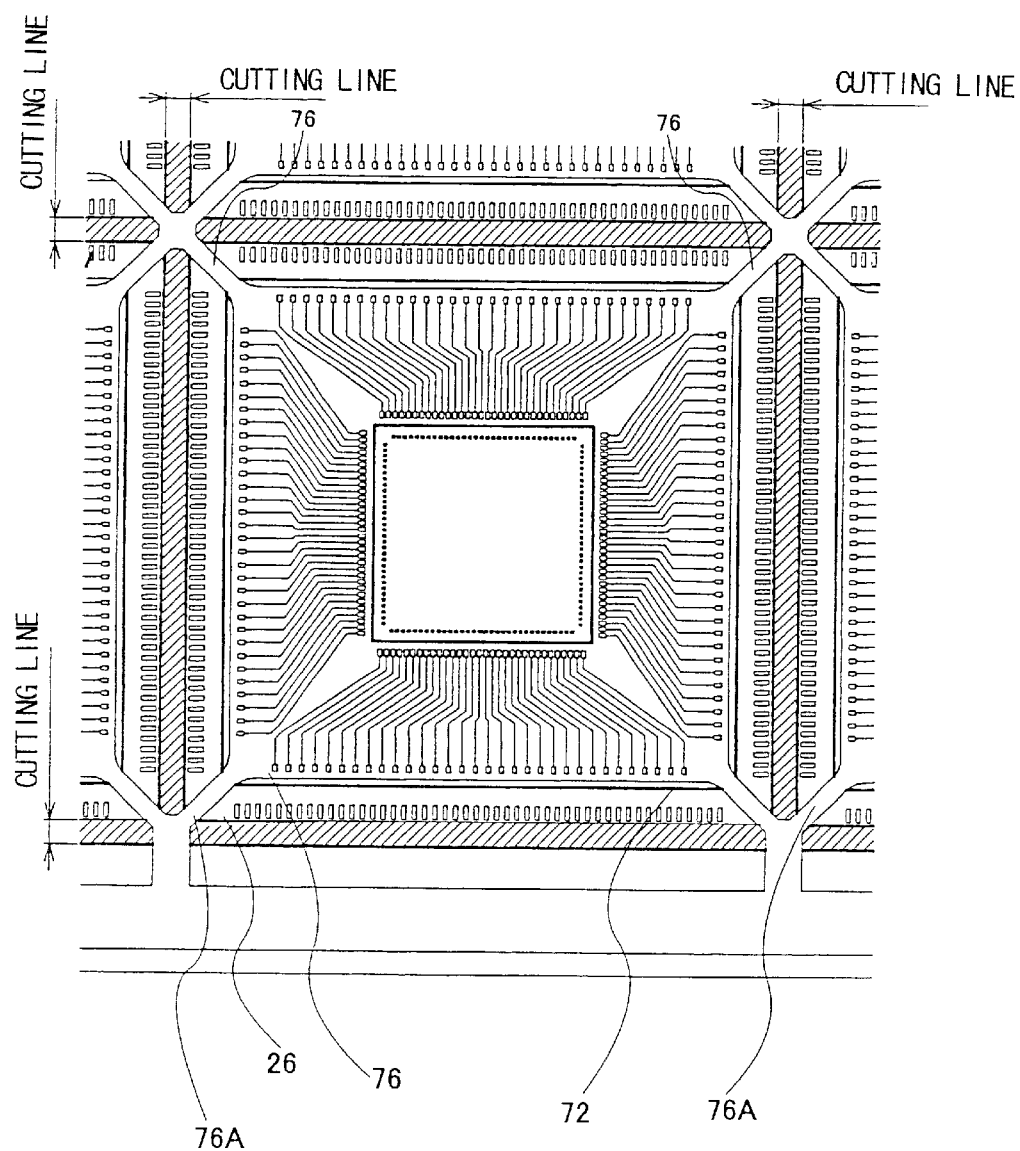
FIG. 18 is a plane view showing a state in which a flexible printed wiring boar is stacked on a lower semiconductor chip.

In the semiconductor devices according to the above-mentioned second embodiment and its variations, an effect of discharging water from inside the semiconductor device during a solder reflow process can be achieved by constituting the flexible printed wiring board 76 (second substrate) as shown in FIG. 18. FIG. 18 is a plane view showing a state in which the flexible printed wiring board 76 is stacked on the lower semiconductor chip 72.

In the manufacturing process of the semiconductor device according to the present invention, a plurality of lower semiconductor chip 72 may be arranged adjacent to each other and the flexible printed wiring board 76 and the upper semiconductor chip 74 may be stacked on each of the lower semiconductor chip 72. The upper and lower semiconductor chips 74 and 72 are encapsulated by the encapsulation resin, and then the thus-manufactured semiconductor devices are separated from each other by dicing. In such as case, a plurality of flexible printed wiring board 76 as the second substrate are supplied in the form of a single sheet.

Figure 19:
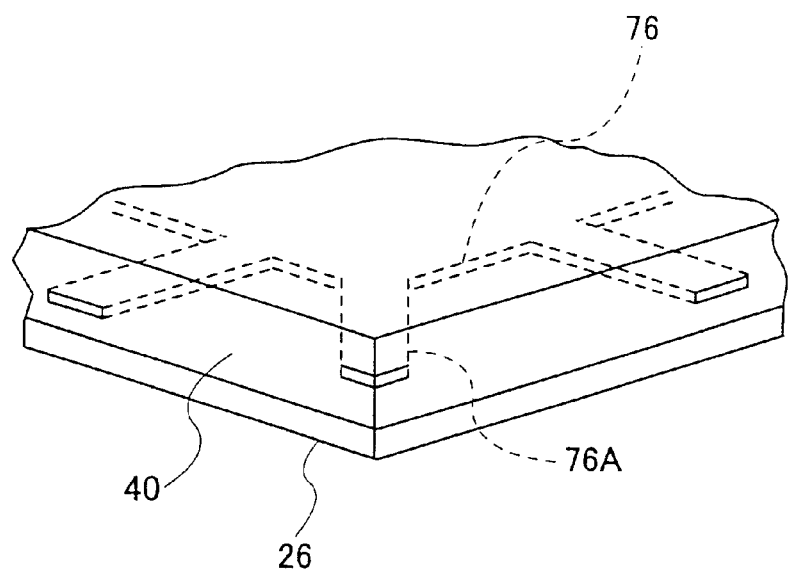
FIG. 19 is a perspective view showing cut surfaces off extending portions shown in FIG. 18.

If the flexible printed wiring boards 76 in a single sheet are connected at their four corners as shown in FIG. 18, an extending portion 76A which connects the adjacent ones of the flexible printed wiring boards 76 is cut along a cutting line (dicing line) to separate the semiconductor devices. Accordingly, as shown in FIG. 19, the end surface (cutting surface) of the extending portion 76A of the second substrate that has been cut is exposed in the side surface of the separated semiconductor device.

If the end surface of the extending portion 76A of the flexible printed wiring board 76 as the second substrate is exposed from the encapsulation resin 40 of the semiconductor device, water existing inside the semiconductor device moves along the interface between the extending portion 76A and the encapsulation resin 40 during a solder reflow process, and discharged from the side surface of the semiconductor device. Thus, generation of a void inside the semiconductor device due to evaporation of the water during a solder reflow process can be prevented, thereby improving the reliability of the semiconductor device.

It should be noted that the position of the extending portion 76A is not limited to the four corners of the flexible printed wiring board 76, and is positioned at any position along the sides of the flexible printed wiring board 76. In FIG. 19, one of the cut surfaces of the extending portions 76A positioned in the middle corresponds to the one provided to one of the four corners of the flexible printed wiring board 76. The cut surfaces on the left and right sides correspond to the extending portions being provided to the sides of the flexible printed wiring board 76.

Figure 20:
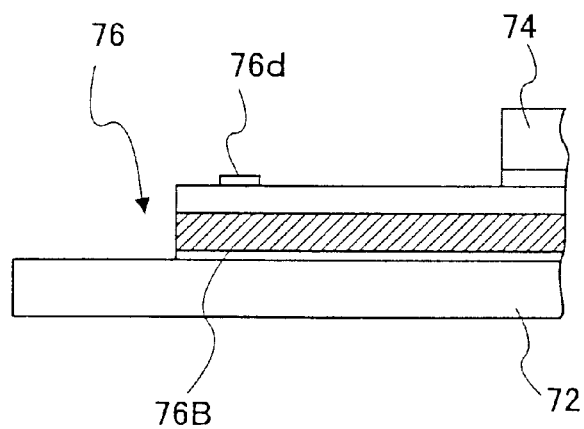
FIG. 20 is a side view of a part of a semiconductor device in which a metal layer if provided on a second substrate.

Moreover, heat of the semiconductor chips 72 and 74 can be diffused and released by providing a layer of a material having a good thermal conductivity, such as a metal layer 76B as shown in FIG. 20, on an entire surface of the flexible printed wiring board 76 as the second substrate. Thereby, the temperature inside the semiconductor device can be averaged even if there is a large, local heat generation, and a local temperature rise can be prevented. Moreover, the heat releasing effect of the extending portion 76 can be further improved.

In the above-mentioned embodiments, the semiconductor chips stacked in the semiconductor device may be connected to each other in the package. For example, the upper semiconductor chips 74-1 and 74-2 shown in FIG. 13 can be merely connected to the lower semiconductor chip 72 via the flexible printed wiring board 76. Generally, in the stacked semiconductor device, there is a case in which the semiconductor chip is operated only inside the semiconductor device and there is no need to provided external connections.

However, after the semiconductor chip is packaged as a semiconductor device, each semiconductor device must be subjected to a test so as to check its function. In order to conduct such as test, an external test circuit must be connected to each semiconductor device. Since the semiconductor chip that functions only in the semiconductor device does not need terminals for external connection, the external terminals are provided only for the test. That is, the semiconductor device is provided with test terminals that are exclusively used for a test, which results in an increase in the size of the semiconductor device.

Figures 21A, 21B:
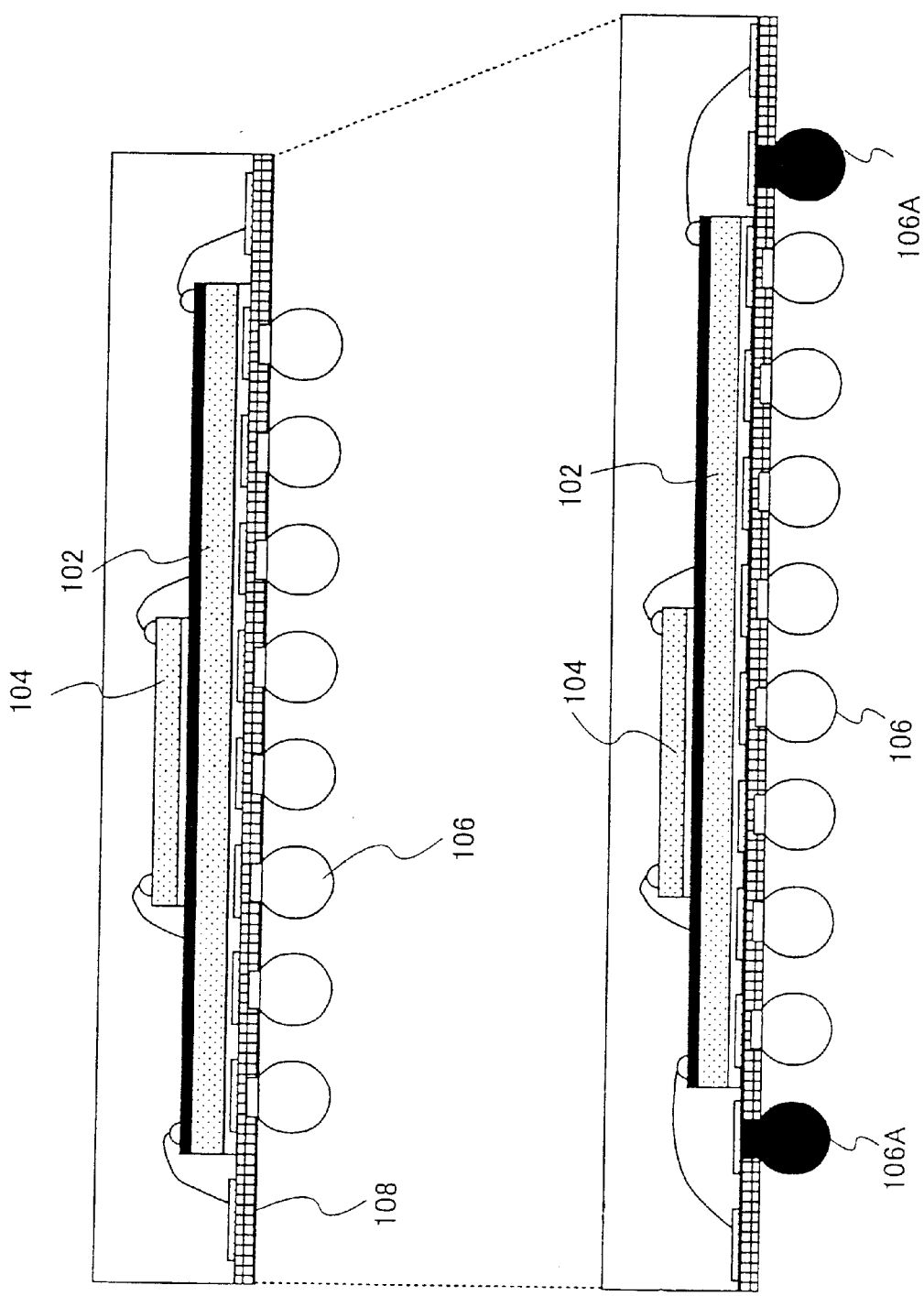
FIG. 21A is a cross-sectional view of a semiconductor device having no test terminal.
FIG. 21B is a cross-sectional view of a semiconductor device having test terminals.

FIG. 21A is a cross-sectional view of a semiconductor device having no test terminal. FIG. 21B is a cross-sectional view of a semiconductor device having test terminals. Although each of the semiconductor devices shown in FIGS. 21A and 21B has a lower semiconductor chips 102 and an upper semiconductor chip 104 of the same size, the size of the semiconductor device shown in FIG. 21A is increased due to formation of the test terminals 106A on a substrate 108 in addition to regular terminals 106.

Accordingly, a semiconductor device having a test circuit therein has been suggested so as to provide a self diagnosis function. The self diagnosis technique is generally referred to as Built in Self Test (BIST), and the purpose of the BIST is to facilitate a test of semiconductor devices. By using a semiconductor device according to the BIST technique, there is no need to provide the test terminals, which prevents the increase in the size of the semiconductor device due to the increase in the number of terminals. However, in order to use the BIST technique, it must be considered as to whether or not the test circuit is incorporated at the development stage of the semiconductor device. Especially, when a plurality of semiconductor chips are stacked, the combination of the semiconductor chips must be considered at the development stage. Accordingly, when the BIST technique is used, the test circuit to be incorporated must be determined in consideration with the stacking of semiconductor chips from the design stage of the semiconductor device, which requires considerable time and labor for the design of the semiconductor device. Moreover, there is a problem in that it is difficult to use the BIST technique for a conventional structure in which semiconductor chips have been already combined.

Figures 22A, 22B:
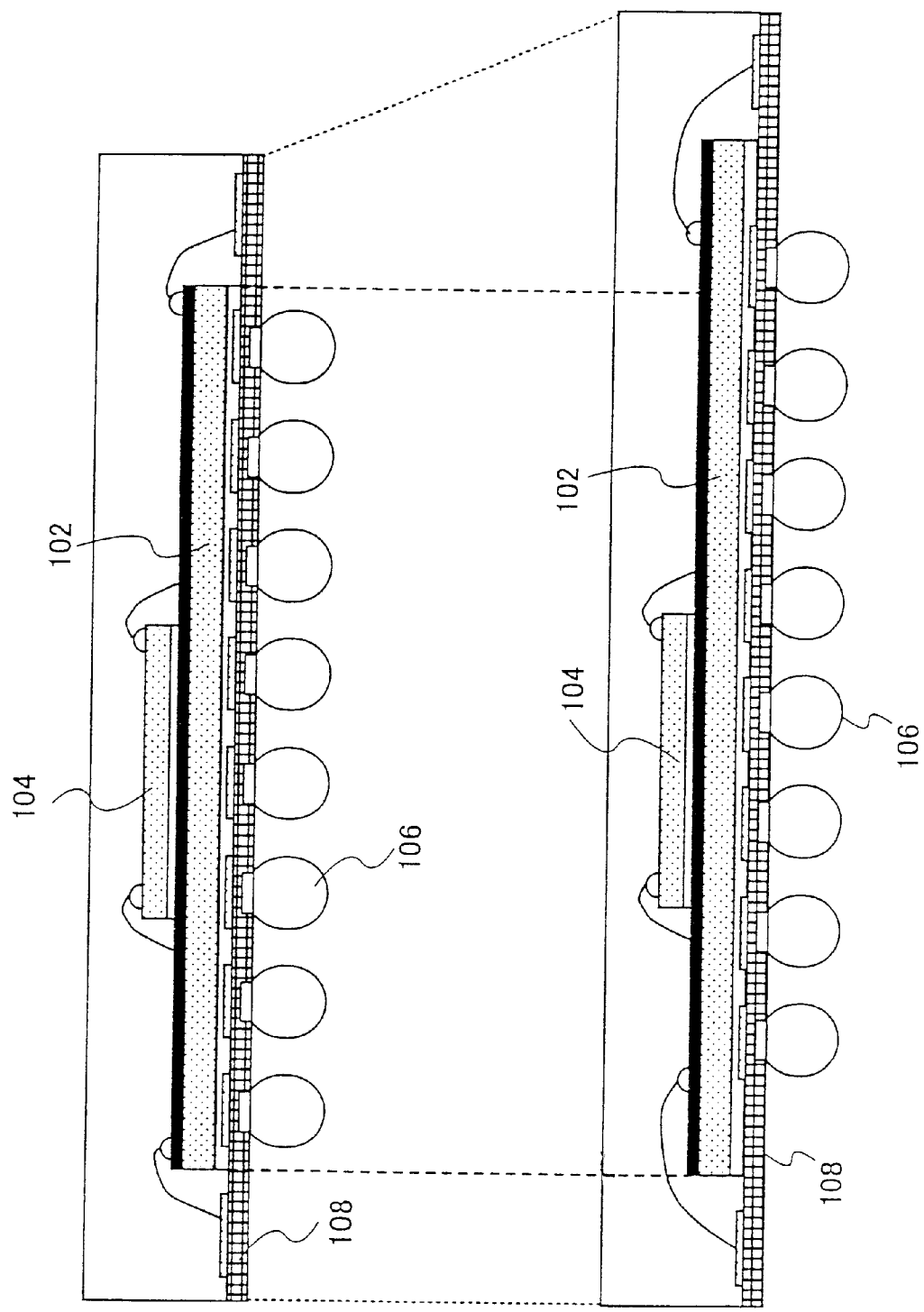
FIG. 22A is a cross-sectional view of a semiconductor device having a lower semiconductor chip having no test circuit.
FIG. 22B is a cross-sectional view of a semiconductor chip having a lower semiconductor chip having test circuit.
Figure 23A:
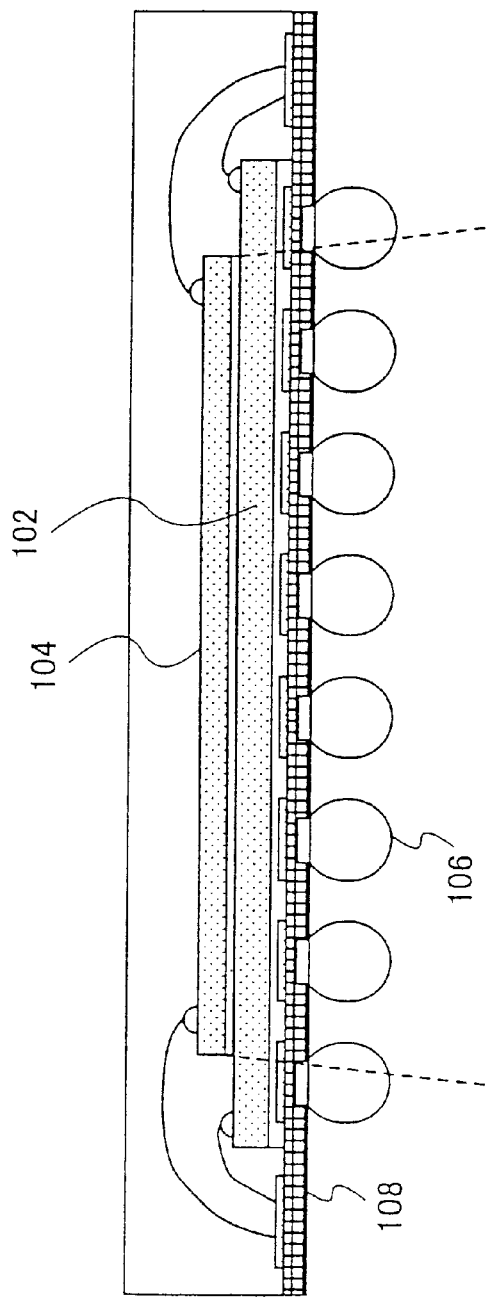
FIG. 23A is a cross-sectional view of a semiconductor device having an upper semiconductor chip having no test circuit.
Figure 23B:
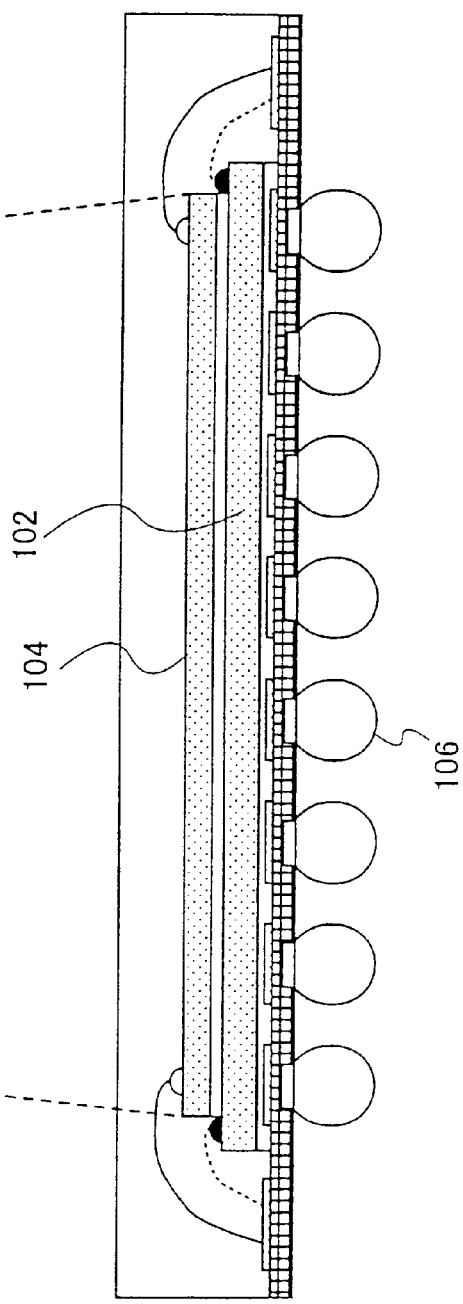
FIG. 23B is a cross-sectional view of a semiconductor chip having an upper semiconductor chip having test circuit.

Additionally, the size of the semiconductor chip is increased due to the incorporation of the test circuit in the semiconductor device even when the number of terminals is reduced by using the BIST technique. For example, as shown in FIGS. 22A and 22B, when the test circuit is incorporated into a lower semiconductor chip 102 on which a semiconductor chip is stacked, the size of the substrate 108 increases as the size of the semiconductor chip 102 increases, which results in an increase in the overall size of the semiconductor device. Additionally, as shown in FIGS. 23A and 23B, when the test circuit is incorporated into an upper semiconductor chip 104, there may be a problem in that the semiconductor device having the test circuit cannot be stacked although the semiconductor device having no test circuit can be stacked.

In order to solve the above-mentioned problems, in a third embodiment of the present invention, a semiconductor chip exclusive for a test is produced separately so as to be added to the semiconductor chips to be stacked.

Figure 24:
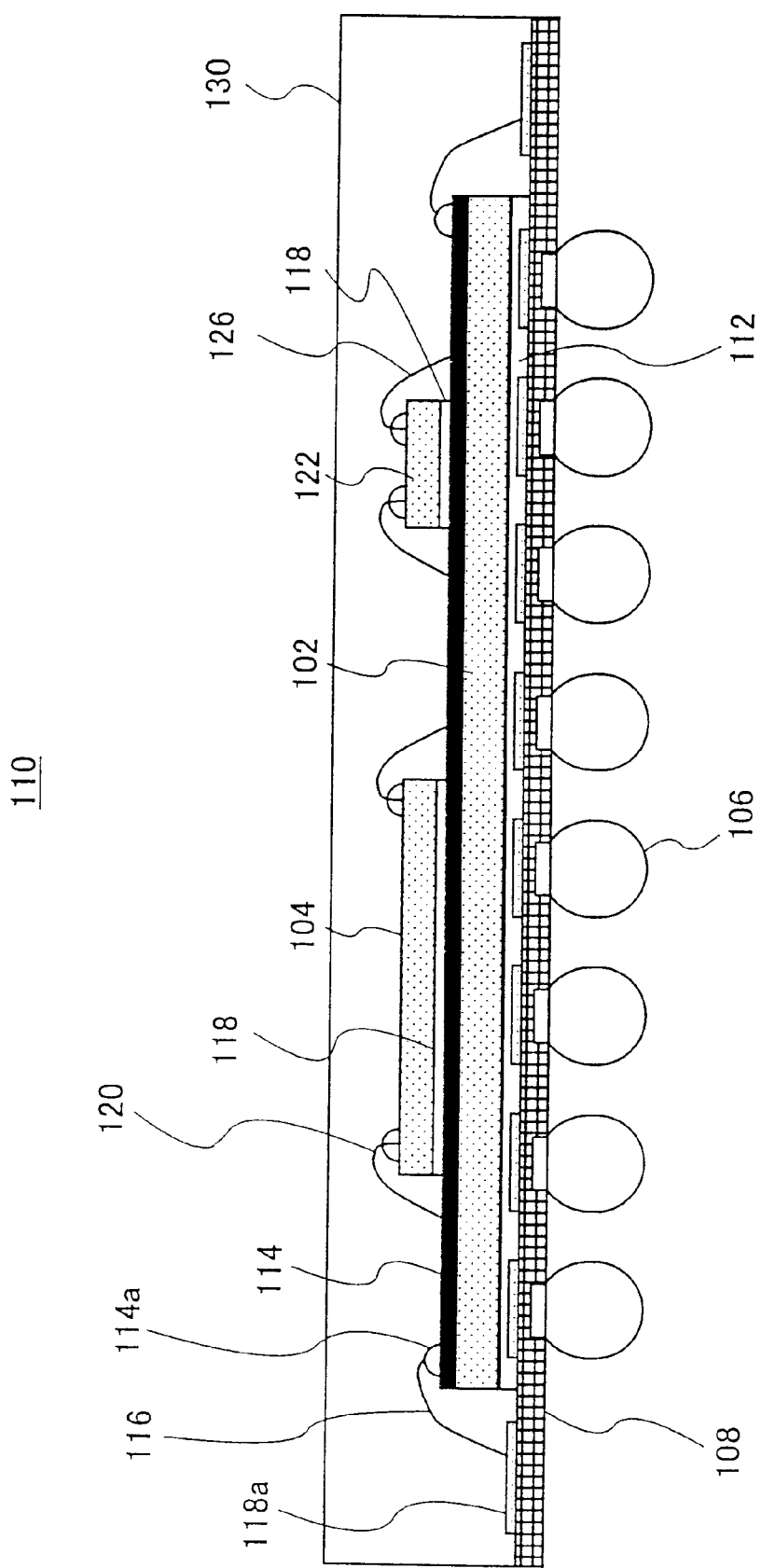
FIG. 24 is a cross-sectional view of a stacked semiconductor device according to a third embodiment of the present invention.

FIG. 24 is a cross-sectional view of a stacked semiconductor device 110 according to the third embodiment of the present invention. In the stacked semiconductor device 110, the lower semiconductor chip 102 is mounted to a substrate 108 via an adhesive 112 in a face-up state. A redistribution layer 114 is formed on the circuit forming surface of the semiconductor chip 102. Electrodes provided on the redistribution layer 114 are connected to electrodes 108a provided on the substrate 108 by bonding wires 116. The upper semiconductor chip 104 is secured to the redistribution layer 114 by an adhesive 118. The electrodes of the semiconductor chip 104 are connected to the redistribution layer 114 by bonding wires 120.

In the present embodiment, a semiconductor chip 122 having sorely a test circuit is mounted in an empty space of the redistribution layer 114, and is secured by an adhesive 124. Electrodes of the semiconductor chip 122 are connected to the redistribution layer 114 by bonding wires 126. That is, in order to provided the semiconductor chip 122, it is preferable that the lower semiconductor chip 102 is sufficiently larger than the upper semiconductor chip 104 so that an empty space is defined on the redistribution layer 114.

The lower semiconductor chip 102, the upper semiconductor chip 104, the semiconductor chip 122 for testing and bonding wires 116, 120 and 126 are encapsulated on the substrate 108 by encapsulation resin 130.

In the above-mentioned structure, the semiconductor chip 122 for testing is connected to both the semiconductor chips 102 and 104 so as to provide the test circuit for testing the semiconductor chips 102 and 104. Accordingly, the test of the semiconductor chips 102 and 104 can be performed by merely providing terminals for inputting test data from outside and for outputting a result of the test. That is, there is no need to provide terminals 106 to the substrate 108 so as to connect the terminals of the semiconductor chips 102 and 104 to an external test circuit. The test of the semiconductor chips 102 and 104 can be achieved by adding terminals necessary for the semiconductor chip 122.

The semiconductor chip 122 for testing can be designed after the semiconductor chips 102 and 104 to be stacked are determined, or the semiconductor chip 122 can be produced previously by incorporating a standardized test circuit. The semiconductor chip 122 has only the test circuit, thereby achieving an efficient and rapid test. Additionally, the test can be simplified and the test time can be reduced.

It should be noted that although the upper semiconductor chip 104 and the semiconductor chip 122 for testing are mounted to the redistribution layer provided on the lower semiconductor chip 102 in the stacked semiconductor device 110 shown in FIG. 24, the redistribution layer 114 may be formed by the flexible printed wiring board 76 as shown in FIG. 10. The flexible printed wiring board 76 can be formed, for example, by applying a conductive material such as a copper foil to a polyimide tape, and patterning the conductive material. When the flexible printed wiring board 76 is used, such a structure corresponds to a structure in which one of the semiconductor chips 74-1 and 74-2 in the semiconductor device 90 shown in FIG. 13 is replaced by the semiconductor chip 122 for testing.

Figure 25:
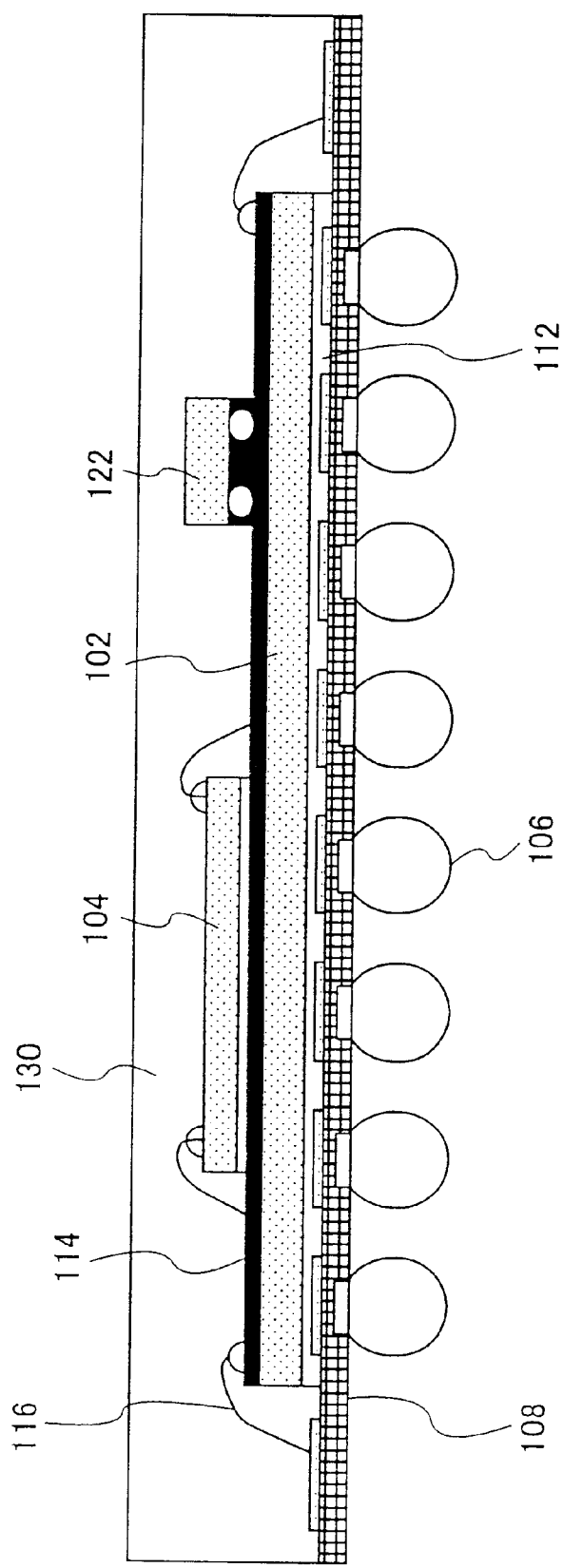
FIG. 25 is a cross-sectional view of a first variation of the semiconductor device according to the third embodiment of the present invention.
Figure 26:
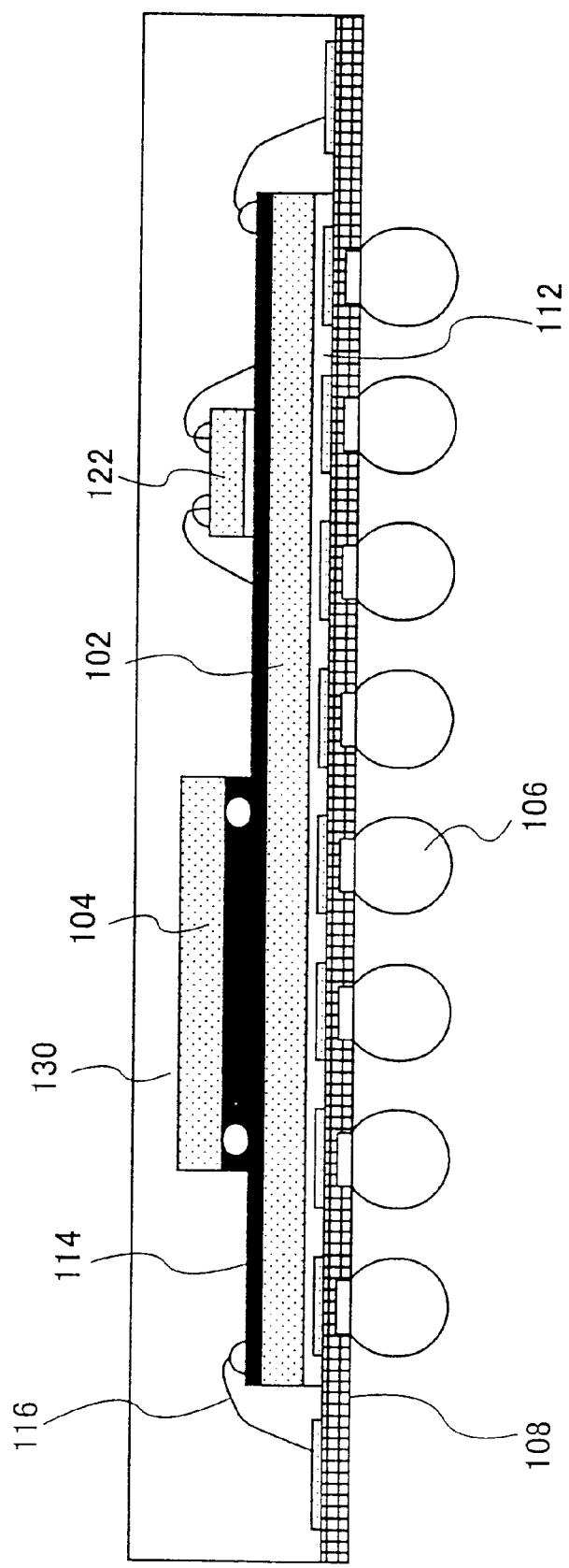
FIG. 26 is a cross-sectional view of a second variation of the semiconductor device according to the third embodiment of the present invention.
Figure 27:
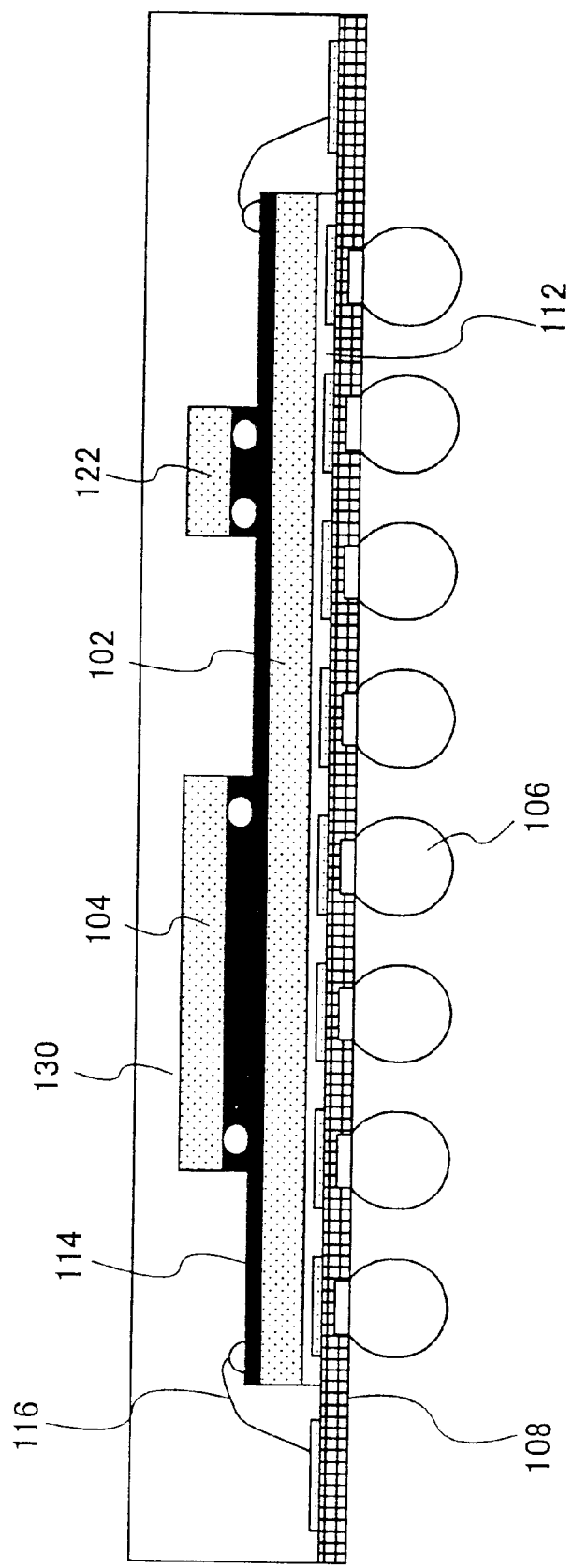
FIG. 27 is a cross-sectional view of a third variation of the semiconductor device according to the third embodiment of the present invention.

FIGS. 25 through 27 show variations of the stacked semiconductor device 110 shown in FIG. 24.

FIG. 25 is a cross-sectional view of a first variation of the semiconductor device 110. The first embodiment shown in FIG. 25 has basically the same structure as the semiconductor device 110 shown in FIG. 24 except for the semiconductor chip 122 for testing being mounted to the redistribution layer 114 in a face-down state. That is, the semiconductor chip 122 is mounted to the redistribution layer 114 by flip-chip bonding, and the upper semiconductor chip 104 is mounted to the redistribution layer 114 in a face-up state and connected by wire bonding.

FIG. 26 is a cross-sectional view of a second variation of the semiconductor device 110. The second embodiment shown in FIG. 26 has basically the same structure as the semiconductor device 110 shown in FIG. 24 except for the semiconductor chip 104 being mounted to the redistribution layer 114 in a face-down state. That is, the upper semiconductor chip 104 is mounted to the redistribution layer 114 by flip-chip bonding, and the semiconductor chip 122 is mounted to the redistribution layer 114 in a face-up state and connected by wire bonding.

FIG. 27 is a cross-sectional view of a third variation of the semiconductor device 110. The third variation shown in FIG. 27 has basically the same structure as the semiconductor device 110 shown in FIG. 24 except for the semiconductor chip 122 for testing being mounted to the redistribution layer 114 in a face-down state and the semiconductor chip 104 being mounted to the redistribution layer 114 also in a face-down state. That is, the semiconductor chip 122 is mounted to the redistribution layer 114 by flip-chip bonding, and the upper semiconductor chip 104 is mounted to the redistribution layer 114 also by flip-chip bonding.

The present invention is not limited to the specifically disclosed embodiments, and variations and modifications may be made without departing from the scope of the present invention.

The present application is based on Japanese priority applications No. 2000-267621, filed on Sep. 4, 2000, and No. 2001-121539 filed on Apr. 19, 2001, the entire contents of which are hereby incorporated by reference.

What is claimed is:

1. A stacked semiconductor device comprising:

a first substrate that has external connecting terminals;

first terminals that are placed on a surface of the first substrate opposite to a surface of the first substrate on which the external connecting terminals of the first substrate are formed;

at least one first semiconductor chip that is mounted on the first substrate;

a redistribution layer provided on the first semiconductor chip;

at least one second semiconductor chip that is mounted on the redistribution layer; and a third semiconductor chip that is used for testing at least one of the first and second semiconductor chips, the third semiconductor chip being mounted on the redistribution layer and over the first semiconductor chip so as to be in a stacked relationship with the first semiconductor chip, wherein at least one of the first and second semiconductor chip is electrically connected to the first substrate via the redistribution layer, and the third semiconductor chip is electrically connected to the redistribution layer.

2. The stacked semiconductor device as claimed in claim 1, wherein the redistribution layer is formed by patterning a copper plate or a copper foil.

3. The stacked semiconductor device as claimed in claim 1, wherein the redistribution layer is formed of a flexible printed wiring board.

4. The stacked semiconductor device as claimed in claim 3, wherein the flexible printed wiring board is made of a polyimide tape on which a conductive pattern is formed.

* * * * *

UNITED STATES PATENT AND TRADEMARK OFFICE
CERTIFICATE OF CORRECTION

PATENT NO. : 6,621,169 B2  Page 1 of 1
DATED : September 16, 2003
INVENTOR(S) : Yuji Akashi et al.

It is certified that error appears in the above-identified patent and that said Letters Patent is hereby corrected as shown below:

<u>Title page,</u>
Item [75], Inventor, delete the following inventors:
" Katsuhito Kikura, Kawasaki (JP); Mitsutaka Ikeda, Kawasaki (JP); and Yoshihiro Tsukidate, Kawasaki (JP)".

Signed and Sealed this

Eleventh Day of May, 2004

JON W. DUDAS
*Acting Director of the United States Patent and Trademark Office*